(12) United States Patent
Albel et al.

(10) Patent No.: US 10,911,165 B1
(45) Date of Patent: Feb. 2, 2021

(54) SYSTEM AND METHOD FOR CALIBRATING A FREQUENCY DOUBLER

(71) Applicant: Infineon Technologies AG, Neubiberg (DE)

(72) Inventors: Siegfried Albel, Arriach (AT); Michael Aichner, Strassen (AT); Reinhard-Wolfgang Jungmaier, Alkoven (AT); Dennis Noppeney, Cologne (DE); Christoph Rumpler, Munich (DE); Saverio Trotta, Munich (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 16/724,888

(22) Filed: Dec. 23, 2019

(51) Int. Cl.
| | | |
|---|---|---|
| *H03L 7/197* | (2006.01) | |
| *H04B 17/21* | (2015.01) | |
| *H03K 5/00* | (2006.01) | |
| *H03K 3/017* | (2006.01) | |
| *H03M 1/12* | (2006.01) | |
| *H04L 7/00* | (2006.01) | |
| *H03K 19/20* | (2006.01) | |
| *H04L 7/033* | (2006.01) | |

(52) U.S. Cl.
CPC ............ *H04B 17/21* (2015.01); *H03K 3/017* (2013.01); *H03K 5/00006* (2013.01); *H03K 19/20* (2013.01); *H03M 1/12* (2013.01); *H04L 7/0037* (2013.01); *H03K 2005/00019* (2013.01); *H03L 7/1976* (2013.01); *H04L 7/0331* (2013.01)

(58) Field of Classification Search
USPC .......................... 327/122, 175, 116; 398/182
See application file for complete search history.

(56) References Cited

U.S. PATENT DOCUMENTS

| | | | | | |
|---|---|---|---|---|---|
| 5,365,181 | A * | 11/1994 | Mair | ................... | H03K 5/00006 327/116 |
| 5,550,499 | A * | 8/1996 | Eitrheim | ............... | H03K 5/1565 327/175 |
| 5,963,071 | A * | 10/1999 | Dowlatabadi | ...... | H03K 5/00006 327/116 |
| 6,211,708 | B1 * | 4/2001 | Klemmer | ............... | H03B 21/01 327/122 |
| 6,253,066 | B1 * | 6/2001 | Wilhite | .................. | H03D 7/165 327/238 |
| 6,711,360 | B1 * | 3/2004 | Wu | ........................ | H03B 21/00 327/175 |

\* cited by examiner

*Primary Examiner* — Eva Y Puente
(74) *Attorney, Agent, or Firm* — Slater Matsil, LLP

(57) ABSTRACT

In accordance with an embodiment, a method includes: receiving, by an adjustable frequency doubling circuit, a first clock signal having a first clock frequency; using the adjustable frequency doubling circuit, generating a second clock signal having a second clock frequency that is twice the first clock frequency; measuring a duty cycle parameter of the second clock signal, where the duty cycle parameter is dependent on a duty cycle of the first clock signal or a duty cycle of the second clock signal; and using the adjustable frequency doubling circuit, adjusting the duty cycle of the first clock signal or the second clock signal based on the measuring.

27 Claims, 13 Drawing Sheets

SYSTEM AND METHOD FOR CALIBRATING A FREQUENCY DOUBLER

TECHNICAL FIELD

The present invention relates generally to a system and method for calibrating a frequency doubler.

BACKGROUND

In many radio frequency (RF) systems, such as portable wireless devices designed to operate in LTE or 5G based cellular systems, a wide variety circuits and systems are used to implement RF and baseband functions. For example, most systems include an RF downconverter that downconverts RF signals received from an antenna to baseband and/or to an intermediate frequency signals, an analog-to-digital converter (ADC) that digitizes the downconvertered RF signals, a processor that performs computation and processing on the digitized signals, a digital-to-analog converter (DAC) that generates baseband or intermediate signals for transmission, an RF upconverter that upconverts the baseband or intermediate signals to an RF frequency for transmission over an antenna. In addition to the requisite signal path circuitry, such as amplifiers, mixers, filters, and data conversion circuits and processing circuits used to implement these functions, each of these functions may require clock signals or oscillator signals for operation. For example, the RF downconverters and RF upconverters generally utilize RF local oscillator (LO) signals, and the ADC, DAC and processor utilize digital clock signals. Accordingly, such RF systems additionally include frequency generation circuitry to support RF, baseband and processing functionality.

Many RF systems use frequency generation systems in which one the frequency of one or more voltage-controlled oscillators (VCOs) is referenced to the frequency of a crystal oscillator using one or more phase-locked loop (PLL) circuits. One or more additional PLLs or delay locked loops (DLLs) may also be used to generate high frequency clocks for the digital processor and/or the data converters. In some cases, these clock and oscillator signals may have performance requirements governing phase noise and duty cycle. Designing frequency generation systems in portable devices that are configured to generate such a multiplicity of clock signals that meet performance requirements in a cost effective manner presents a number of challenges and trade-offs with respect to board space, component cost and power consumption.

SUMMARY

In accordance with an embodiment, a method includes: receiving, by an adjustable frequency doubling circuit, a first clock signal having a first clock frequency; using the adjustable frequency doubling circuit, generating a second clock signal having a second clock frequency that is twice the first clock frequency; measuring a duty cycle parameter of the second clock signal, where the duty cycle parameter is dependent on a duty cycle of the first clock signal or a duty cycle of the second clock signal; and using the adjustable frequency doubling circuit, adjusting the duty cycle of the first clock signal or the second clock signal based on the measuring.

In accordance with another embodiment, a system includes: an adjustable frequency doubling circuit including a clock input, a clock output and a duty cycle adjustment input, the adjustable frequency doubling circuit configured to receive a first clock signal having a first clock frequency at the clock input, generate a second clock signal having a second clock frequency that is twice the first clock frequency at the clock output, and adjust a duty cycle of the first clock signal or the second clock signal based on a duty cycle adjustment signal received at the duty cycle adjustment input; and a duty cycle measurement and adjustment circuit coupled to the clock output and to the duty cycle adjustment input of the adjustable frequency doubling circuit, the duty cycle measurement and adjustment circuit configured to measure a duty cycle parameter of the second clock signal and generate the duty cycle adjustment signal based on the measured duty cycle parameter.

In accordance with a further embodiment, an RF system includes: an RF front-end having an input port configured to be coupled to an antenna; a test tone generation circuit; a multiplexer having a first input coupled to an output of the RF front-end, and a second input coupled to an output of the test tone generation circuit; an adjustable frequency doubling circuit including a clock input, a clock output and a duty cycle adjustment input, the adjustable frequency doubling circuit configured to receive a first clock signal having a first clock frequency at the clock input, generate a second clock signal having a second clock frequency that is twice the first clock frequency at the clock output, and adjust a duty cycle of the first clock signal or the second clock signal based on a duty cycle adjustment signal received at the duty cycle adjustment input; and an analog-to-digital converter (ADC) having a clock input coupled to the clock output of the adjustable frequency doubling circuit, an ADC signal input coupled to an output of the multiplexer, and an ADC signal output configured to provide a first time domain digital signal.

Figure 1A:
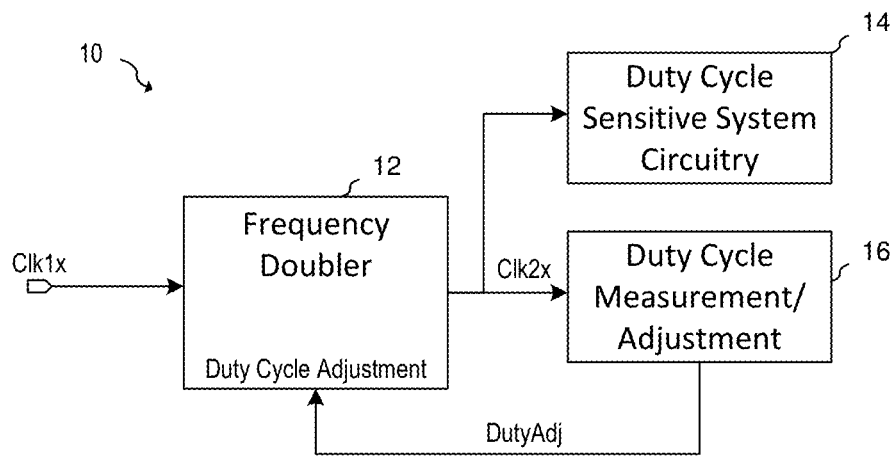
FIGS. 1A and 1B illustrate embodiment frequency doubler systems.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a system and method for calibrating a frequency doubler used in a radio transceiver.

In various embodiments, the frequency of an input clock signal is doubled using an adjustable clock doubling circuit configured to provide a clock signal having an adjustable duty cycle. By calibrating the doubled clock signal to have a duty cycle that is substantially 50% by adjusting the duty cycle of the doubled clock signal, the doubled clock signal can be used to clock duty cycle sensitive circuitry such as an ADC or a phase-locked loop circuit. In some embodiments, the duty cycle is calibrated by providing a test tone, such as an analog test tone, to the ADC, monitoring the spurious response of the ADC converter, and iteratively adjusting the duty cycle of the clock doubling circuit to reduce or minimize the spurious response of the ADC converter. In other embodiments, the doubled clock signal may be directly monitored during calibration to determine and calibrate the duty cycle of the doubled clock signal.

Alternatively or in addition to adjusting the duty cycle of the double clock signal, the duty cycle of the input clock signal may be adjusted prior to the input clock signal being doubled. In various cases, the presence of a duty cycle error on the input clock signal may cause a periods of alternating duration on the doubled clock signal. These periods of alternating duration may cause spurious behavior when used as input to circuits that are sensitive to such errors on doubled clock signals. Circuits that exhibit such sensitivity include, for example, ADCs that use an odd number of clock cycles for each conversion. Thus, in various embodiments, the duty cycle of the input clock signal may be adjusted or calibrated to be substantially 50% prior to the input clock signal being doubled, thereby advantageously reducing the spurious behavior of data converters and other circuitry.

In some portable wireless systems, the clock frequencies needed to clock data converters and phase-locked loop (PLL) circuits may be higher than clock frequencies routinely used to clock digital processing circuits. For example, in some systems, 38.4 MHz crystals are routinely used to generate clock signals for application processors, while higher clock frequencies in the neighborhood of 80 MHz may be used to clock analog-to-digital converters and PLL circuits. In some systems, because of the relatively large size of oscillator crystals and the limited amount of board space available in compact portable wireless devices, the higher clock frequency used to provide clock signals to data converters and PLL circuits is often derived using frequency multiplication circuitry such as a delay locked loop (DLL), an additional PLL, or a delay-based frequency multiplication circuit. While delay-based frequency multiplication circuits may be physically compact and consume relatively low power, some frequency multiplication circuits may be sensitive to duty cycle errors in the clock signal produced by the crystal oscillator and may be additionally prone to produce frequency multiplied clock signals having duty cycles that deviate from 50%. In some cases, these duty cycle errors may degrade the performance of duty cycle sensitive circuitry that is referenced to the multiplied clock signal.

For example, in an analog-to-digital converter that utilizes both edges of a system clock to perform sampling and other operations, clock asymmetries may lead to spurious behavior and reduced spurious-free dynamic range (SFDR). Errors in the duty cycle of the clock may translate into a frequency error that creates in a jump between two frequencies. In addition, charge pump circuits that rely on both edges of the clock may encounter operational difficulty as the duty cycle of the clock deviates from 50%. In an analog-to-digital converter that utilizes an odd number of system clocks to perform an conversion, periodic variation in the length of the clock period of the system clock caused by duty cycle asymmetries of the input clock to a frequency doubler may also lead to spurious behavior and reduced spurious-free dynamic range (SFDR).

Thus, in embodiments of the present invention, a calibrated frequency doubler is used to provide a clock having a duty cycle substantially equal to 50% and/or provide a clock that has substantially equal consecutive clock periods, while advantageously benefiting from the small size and power savings provided by delay-based frequency doubler circuits.

FIG. 1A illustrates an embodiment frequency doubler system 10. As shown, system 10 includes frequency doubler 12, duty cycle sensitive circuitry 14, and a duty cycle measurement and adjustment circuit 16. Duty cycle sensitive system circuitry 14 may include, for example, analog-to-digital converters, duty cycle sensitive voltage boosting circuits such as charge pumps, and/or other circuitry such as PLLs and timing sensitive digital circuits that are sensitive to the duty cycle of its input clock or is sensitive to clock period variations caused by duty cycle errors in a pre-doubled clock. Frequency doubler circuit 12 (also referred to as an "adjustable frequency doubling circuit") is configured to double the frequency of first clock signal Clk1x coupled to a clock input of frequency doubler circuit 12 and form second clock signal Clk2x. For example, if first clock signal Clk1x has a clock frequency of 40 MHz, second clock signal Clk2x would have a clock frequency of 80 MHz. It should be understood, however, that first clock signal Clk1x and second clock signal Clk2x could be any frequency depending on the particular application and its specifications.

As shown, frequency doubler circuit 12 include a duty cycle adjustment input, such that duty cycle adjustment signal DutyAdj is used to adjust the duty cycle of first clock signal Clk1x and/or the duty cycle of second clock signal Clk2x. Duty cycle adjustment signal DutyAdj may be implemented as an analog signal or a digital signal comprising one or more bits. In various embodiments, frequency doubler circuit 12 is implemented using a frequency doubling circuit known in the art. For example, frequency doubler circuit 12 may be implemented using an exclusive or gate and an adjustable delay circuit as explained below. However, in alternative embodiments, other frequency doubling circuits may be used.

Duty cycle measurement and adjustment circuit 16 may be used to directly or indirectly measure the duty cycle of first clock signal Clk1x and/or second clock Clk2x and provide duty cycle adjustment signal DutyAdj in response to these measurements. The measured duty cycle or the measured value related to the duty cycle may also be referred to as a duty cycle parameter. In some embodiments duty cycle measurement and adjustment circuit 16 is operational only during a calibration time period, such as during a calibration mode. During periods of normal operation, duty cycle measurement and adjustment circuit 16 may be inactive or powered down. In other embodiments, duty cycle measurement and adjustment circuit 16 may only be operational during manufacturing and/or testing of the particular part. In such cases, all or part of duty cycle measurement and adjustment circuit 16 may reside on test fixture that is separate from the remaining portion of the circuit that includes frequency doubler circuit 12 and duty cycle sensitive system circuitry 14. For example, frequency doubler 12 may be calibrated by duty cycle measurement and adjustment circuit 16 during a wafer or production test of an integrated circuit that includes duty cycle sensitive system circuitry 14. In other embodiments, duty cycle measurement and adjustment circuit 16 may be resident on the same integrated circuit or the same system as frequency doubler circuit 12 and duty cycle sensitive system circuitry 14. In yet other embodiments duty cycle measurement and adjustments circuit 16 may continuously monitor second clock signal Clk2x and provide for a continuous adjustment of the duty cycle of first clock signal Clk1x and/or second clock signal Clk2x produced by frequency doubler circuit 12.

Duty cycle measurement and adjustment circuit 16 may be implemented, for example, using duty cycle measurement circuits known in the art including but not limited to high-speed counters, mixers, and analog-to-digital converters. In addition, duty cycle measurement and adjustment circuit 16 may include digital circuitry such as state machine and/or processing circuits that assist in the measurement of the duty cycle and in the formation of duty cycle adjustment signal DutyAdj.

Figure 1B:
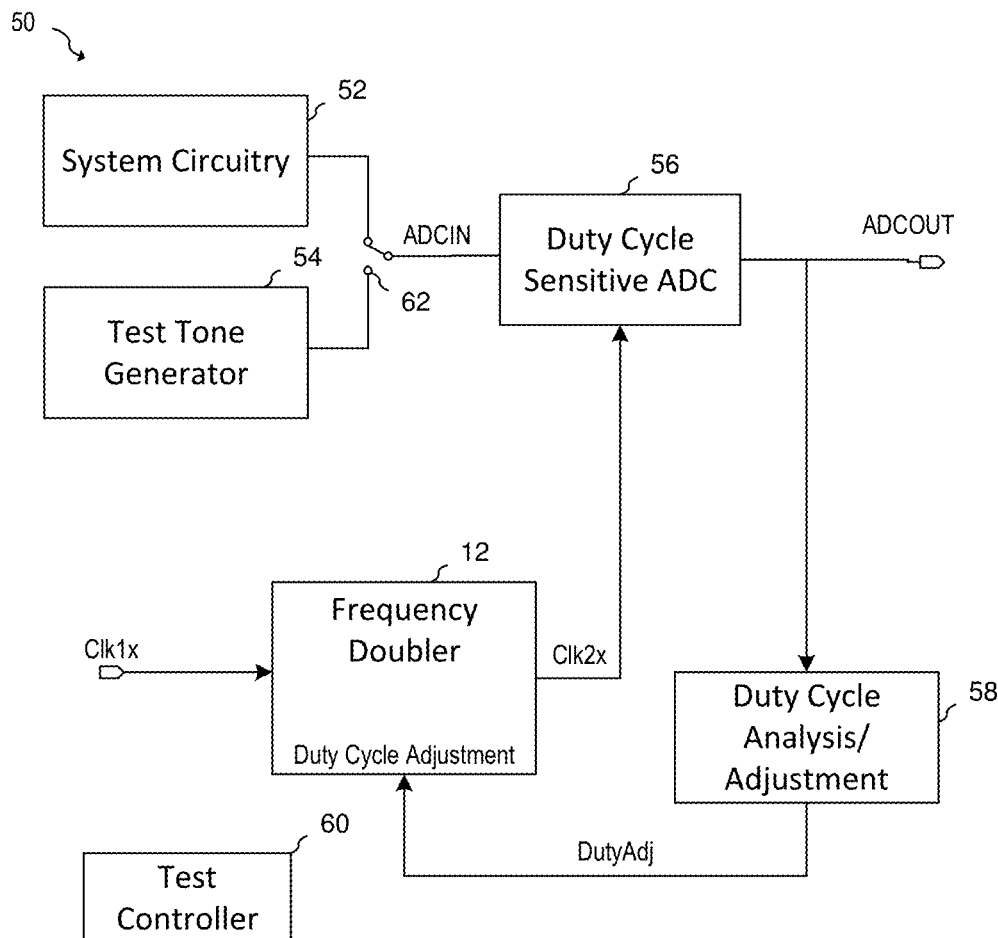

FIG. 1B illustrates frequency doubler system 50 according to an alternative embodiment of the present invention. As shown, frequency doubler system 50 includes a duty cycle sensitive analog-to-digital converter 56 whose input ADCIN (also referred to as an "ADC signal input") is selectively coupled to system circuitry 52 or test tone generator 54 (also referred to as a "test tone generation circuit"). During normal operation of system 50, system circuitry 52 provides an analog signal at input ADCIN of duty cycle sensitive analog-to-digital converter 56 via selection switch 62. As shown, duty cycle sensitive analog-to-digital converter 56 is coupled to second clock signal Clk2x, which provides a clock signal to duty cycle sensitive analog-to-digital converter 56 at a clock input, such that second clock signal Clk2x clocks duty cycle sensitive analog-to-digital converter 56 during operation. System circuitry 52 may include any system circuitry that produces an analog signal utilized by system 50. For example, in RF systems, system circuitry 52 may include an RF front end and/or a down converter that produces an analog signal that is related to a received RF signal. In other systems, system circuitry 52 may generate other types of analog signals including, but not limited to audio signals, sensor signals, image signals, video signals and the like.

Duty cycle sensitive analog-to-digital converter 56 converts the analog signal at input ADCIN to digital signal ADCOUT (also referred to as an "ADC signal output") at the output of duty cycle sensitive analog-to-digital converter 56. Duty cycle sensitive analog-to-digital converter 56 may implemented using a variety of analog-to-digital converter architectures including, but not limited to, successive approximation converters Sigma Delta converters, flash converters pipeline converters, and other data converter architectures known in the art. During calibration, test tone generator 54 provides a test tone to duty cycle sensitive analog-to-digital converter 56, which is analyzed by duty cycle analysis and adjustment circuit 58. In some embodiments, the combination of duty-cycle sensitive analog-to-digital converter 56 and duty cycle analysis and adjustment circuit 58 may also be referred to as a duty cycle measurement and adjustment circuit. Test tone generator 54 may be implemented, for example, using a digital frequency divider and a low pass filter. Other test tone generation circuits known in the art may also be used.

Duty cycle analysis and adjustment circuit 58 is configured to analyze the spurious behavior of digital signal ADCOUT and adjust the duty cycle a frequency doubler circuit 12 using duty cycle adjustment signal DutyAdj. In some embodiments, duty cycle analysis and adjustment circuit 58 iteratively adjusts duty cycle adjustment signal DutyAdj until the spurious response of digital signal ADCOUT meets a predetermined performance requirement and/or a predetermined threshold requirement. In some embodiments, duty cycle analysis and adjustment circuit 58 may reside on the same system integrated circuit, circuit board, and/or housing as system circuitry 52, test tone generator 54, duty cycle sensitive analog-to-digital converter 56 and frequency doubler circuit 12. In other embodiments, duty cycle analysis and adjustment circuit 58 may reside on a separate test fixture used during manufacturing testing and/or calibration of system 50. Duty cycle analysis and adjustment circuit 58 may include, for example, a microprocessor, digital signal processing circuitry, dedicated logic, or other circuitry suitable for determining the spurious response of digital signal ADCOUT according to systems and methods explained further below.

In some embodiments, test controller 60 may be used to configure frequency doubler system 50 to perform a calibration of frequency doubler circuit 12. For example, during calibration, test controller 60 may control switch 62 to route the output of test tone generator 54 to the input of duty cycle sensitive analog-to-digital converter 56. In some embodiments, calibration may occur during a calibration test time or during a calibration mode. Test controller 60 may also initiate the measurement of digital signal ADCOUT by duty cycle analysis and adjustment circuit 58, initiate the adjustment of the duty cycle of frequency doubler circuit 12, and activate test tone generator 54 during duty cycle calibration of frequency doubler circuit 12. In various embodiments, test controller 60 or portions of test controller 60 may reside on the same system integrated circuit, circuit board, and/or housing as system circuitry 52, test tone generator 54, duty cycle sensitive analog-to-digital converter 56 and frequency doubler circuit 12. In other embodiments, of test controller 60 or portions of test controller 60 may reside on a separate test fixture used during manufacturing testing and/or calibration of system 50.

Figure 2A:
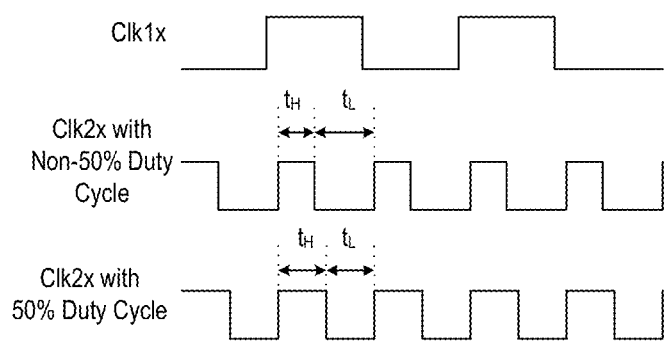
FIGS. 2A-2D illustrate graphs describing the performance of frequency doubler systems.

FIGS. 2A through 2D illustrate waveform diagrams pertaining to embodiments of the present invention. Referring to FIG. 2A, three waveform diagrams are shown. The first waveform diagram shows first clock signal Clk1x, which represents the clock signal presented to the input of frequency doubler circuit 12; the second diagram shows second clock signal Clk2x output from frequency doubler circuit 12 having a non-50% duty cycle; and the third diagram shows second clock signal Clk2x having a 50% duty cycle. As shown, second clock signal Clk2x has a high value for a time period of $t_H$, and a low value for a time period of $t_L$. For non-50% duty cycles, time periods $t_H$ and $t_L$, are not equal. In the illustrated example, time period $t_H$ is shown to be shorter than time period $t_L$. However, in other situations in which second clock signal Clk2x has a non-50% duty cycle, time period $t_H$ could be longer than time period $t_L$. When the duty cycle of second clock signal Clk2x is substantially 50%, time period $t_H$ is substantially equal to time period $t_L$. In various embodiments, the duty cycle of second clock signal Clk2x is adjusted until the duty cycle is substantially 50%. In some embodiments, the duty cycle of second clock signal Clk2x is considered to be substantially 50% when a measured duty cycle parameter is within a predetermined range and/or the duty cycle is adjusted to have an acceptable quality measure.

Figure 2B:
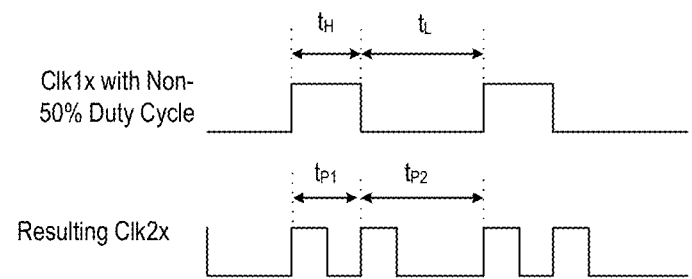

FIG. 2B illustrates a waveform diagram showing first clock signal Clk1x having a non-50% duty cycle, and a resulting second clock signal Clk2x having varying time periods. As shown, first clock signal has a high value for a time period $t_H$ and a low value for a time period $t_L$, where time period $t_H$ is not equal to time period $t_L$. The resulting doubled second clock signal Clk2x has a time periods of alternating duration. For example, in the time period corresponding to time $t_H$ of first clock signal Clk1x, second clock signal Clk2x has a clock period of $t_{P1}$. However, in the time period corresponding to time $t_L$ of first clock signal Clk1x, second clock signal Clk2x has a clock period of $t_{P2}$, where time period $t_{P1}$ is not equal to time period $t_{P2}$. These time periods $t_{P1}$ and $t_{P2}$ alternate with respect to each other. Thus, as the duty cycle of first clock signal Clk1x approaches 50%, the variation between clock periods $t_{P1}$ and $t_{P2}$ of second clock signal is reduced.

In various embodiments, the duty cycle of first clock signal Clk2x is adjusted until the length of consecutive clock periods $t_H$ and $t_L$ have a substantially equal lengths. In some embodiments, the length of consecutive clock periods $t_H$ and $t_L$ are considered to have substantially equal lengths when a measured duty cycle parameter is within a predetermined range and/or the duty cycle of the first clock signal Clk1x is adjusted to have an acceptable quality measure.

Figure 2C:
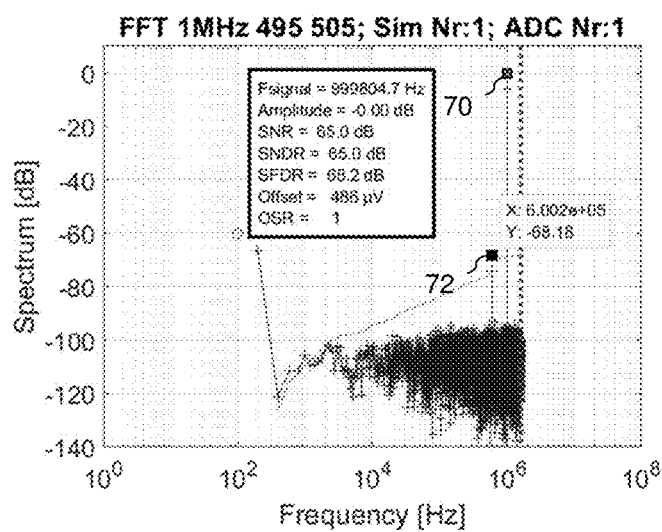

FIG. 2C illustrates a diagram of the output spectrum of duty cycle sensitive analog-to-digital converter 56 when being presented with a 1 MHz test tone from test tone generator 54 at input ADCIN and when being clocked by second clock signal Clk2x having a non-50% duty cycle. The diagram of FIG. 2B was generated using a fast Fourier transform (FFT). The peak of the spectrum at point 70 represents the 1 MHz test tone, while the peak at point 72 represents a frequency spur at 600 KHz caused by the non-50% duty cycle of second clock signal Clk2x.

The specific example shown in FIG. 2C represents a case in which the duration of the sampling intervals of duty cycle sensitive analog-to-digital converter 56 alternate due to the asymmetric nature of the non-50% duty cycle. For example, during operation, a short sampling intervals and long sampling intervals alternate with each other. This alternation in sampling intervals effectively causes a tone at one-half of the sampling frequency $f_s$. This tone mixes with the input tone to cause a spur at:

$$f_{spur}=f_s/2-f_{in},$$

where $f_{spur}$ is the spur frequency and $f_{in}$ is the frequency of the tone generated by test tone generator 54. In the illustrated case where the sampling frequency is 3.2 MHz and the input tone is 1 MHz, the expected spur is at 600 kHz. It should be understood that the above equation assumes that the duration of the sampling intervals alternate at each sampling interval. In alternative embodiments of the invention where duty cycle sensitive analog-to-digital converter 56 is not clocked at every cycle of second clock signal Clk2x, the frequency of the spur may be different from $f_s/2-f_{in}$, depending on the particular clocking scheme of the ADC.

Figure 2D:
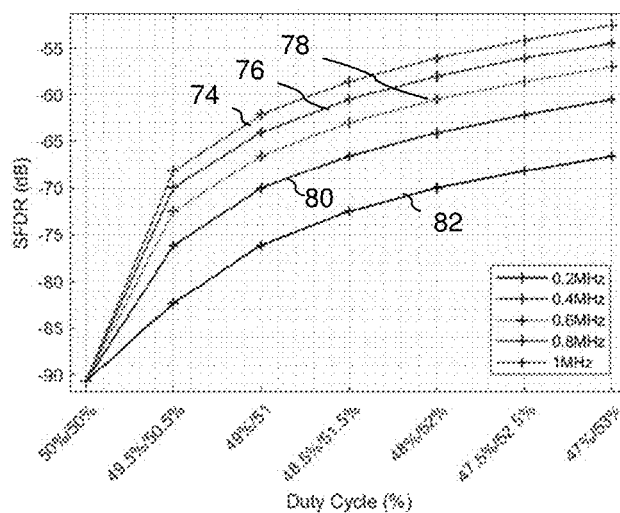

FIG. 2D illustrates a graph of spurious free dynamic range with respect to duty cycle for various frequencies. Curve 74 represents an input frequency of 1 MHz, curve 76 represents an input frequency of 800 kHz, curve 78 illustrates an input frequency of 600 kHz, curve 80 represents an input frequency of 400 kHz, and curve 82 represents an input frequency of 200 kHz. As can be seen by the graph of FIG. 2C, the spurious free dynamic range of duty cycle sensitive analog-to-digital converter 56 degrades as the duty cycle of second clock signal Clk2x diverges from a 50% duty cycle. For example, for a 50% duty cycle, the spurious free dynamic range of duty cycle sensitive analog-to-digital converter 56 exceeds 90 dB. However, for a duty cycle of either 47% or 53%, the spurious free dynamic range of duty cycle sensitive analog-to-digital converter 56 is only about 53 dB. Furthermore, the spurious free dynamic range of duty cycle sensitive analog-to-digital converter 56 also degrades with increasing tone frequency. As shown the spurious free dynamic range with an input tone of 200 kHz is about 66 dB while the spurious free dynamic range with an input tone of 1 MHz is about 53 dB for duty cycle of 47% or 53%. It should be appreciated that the actual resulting spurious free dynamic range may vary depending on the particular architecture used, its architecture, its clocking speed, the amplitude of the input tone, and other factors. While the waveform diagrams of FIGS. 2C and 2D illustrate an example of spurious performance in a system in which the duty cycle of second clock signal Clk2x is varied, similar comparative performance may be seen with respect to an analog-to-digital converter when the duty cycle of first clock signal Clk1x is varied, particularly with respect to analog-to-digital converters that are sensitive to alternating period lengths of second clock signal Clk2x caused by duty cycle errors in first clock signal Clk1x.

Figure 3A:
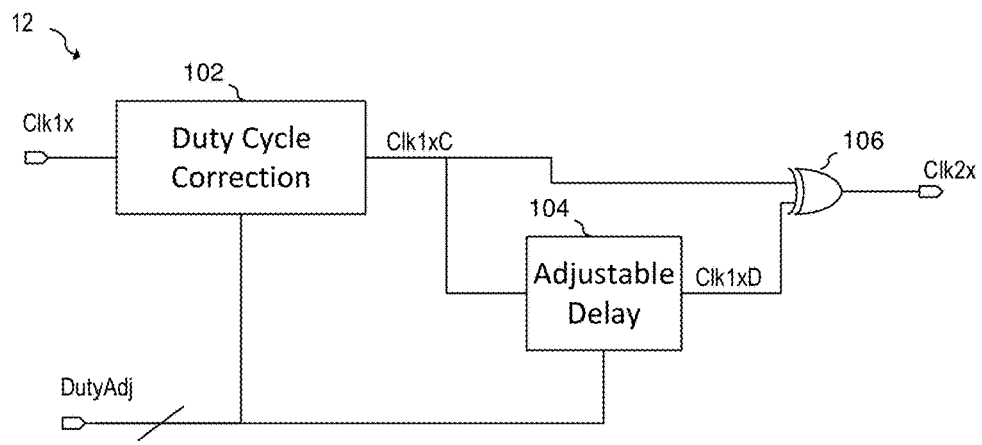
FIGS. 3A-3I illustrate schematics of embodiment frequency doubler circuits.

FIGS. 3A through 3D illustrate schematics of frequency doubler circuit 12 in accordance with an embodiment of the present invention. FIG. 3A illustrates a top-level schematic of frequency doubler circuit 12. As shown, frequency doubler circuit 12 includes duty cycle correction circuit 102, adjustable delay circuit 104 and exclusive-or gate 106. During operation, duty cycle correction circuit 102 corrects the duty cycle of first clock signal Clk1x and produces adjusted duty cycle clock signal Clk1xC. By correcting errors in the duty cycle of first clock signal Clk1x prior to doubling its frequency, a more accurate doubled clock signal frequency may be produced as described above. However, in some embodiments, either duty cycle correction circuit 102 or adjustable delay circuit may be omitted in some embodiments. For example, in embodiments where first clock signal Clk1x already has a relatively accurate duty cycle, duty cycle correction circuit 102 may be omitted, whereas in embodiments in which clocked circuitry is insensitive to non-50% cycles, adjustable delay circuit 104 may be implemented using a fixed delay.

The actual doubling of the clock frequency is performed by adjustable delay circuit 104 and exclusive-or gate 106. During operation, adjustable delay circuit 104 delays adjusted duty cycle clock signal Clk1xC by a quarter of its clock cycle to form delayed first clock signal Clk1xD. By performing an exclusive-or operation on adjusted duty cycle clock signal Clk1xC and delayed first clock signal Clk1xD, a clock signal having twice the frequency of first clock signal Clk1x is generated. By adjusting the delay of adjustable delay circuit 104, the resulting duty cycle of second clock signal Clk2x can be adjusted. In various embodiments, the delay of adjustable delay circuit 104 is set by signal DutyAdj, which is provided to a control input of adjustable delay circuit 104.

Figure 3B:
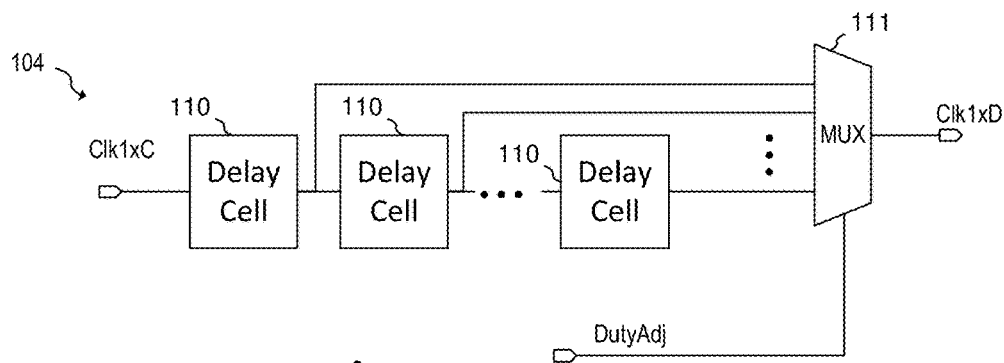

FIG. 3B illustrates a schematic of adjustable delay circuit 104 according to an embodiment of the present invention. As shown, adjustable delay circuit 104 includes a plurality of delay cells 110 coupled in series with each other. Delay cells 110 may also be referred to as selectable delay circuits. Multiplexer 111 selects the output of one delay cell 110 from among the plurality of delay cells 110 according to duty cycle adjustment signal DutyAdj. Thus, for a longer programmed delay, a delay cell 110 coupled near the end of the chain of delay cells may be selected; for a shorter programmed delay, a delay cell 110 coupled near the beginning of the chain of delay cells 110 may be selected. In various embodiments, adjustable delay circuit 104 may contain any number of delay cells 110. The number of delay cells 110 and the amount of time delay that each delay cell 110 is capable of producing may vary depending on the particular an embodiment and its specifications. For example, systems having higher clock frequencies may require less delay and fewer delay cells than systems having lower clock frequencies.

Figure 3C:
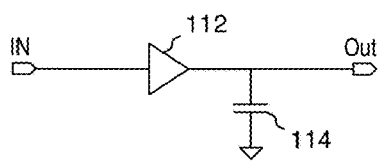
Figure 3D:
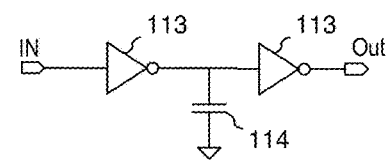
Figure 3E:
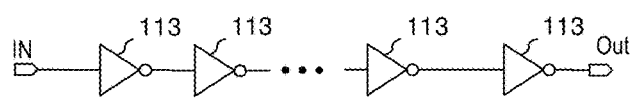

FIGS. 3C-3E illustrate schematics of delay cells that may be used to implement delay cell 110 shown in FIG. 3B. The delay of FIG. 3C includes a buffer 112 loaded by a capacitor 114. The amount of delay time implemented by the delay cell is a function of the strength of buffer 112 and the size of capacitor 114. For example, when the strength of buffer 112 is weak and the size of capacitor 114 is large, delay cell no may produce a longer delay. On the other hand, when buffer 112 has a strong output and the size of capacitor 114 is small, delay cell no may produce a shorter delay. In various embodiments, buffer 112 may be implemented using digital buffer circuitry known in the art. For example, buffer 112 may be implemented using two inverters coupled in series with each other. The delay cell of FIG. 3D includes an inverter 113 loaded by capacitor 114 and buffered by a second inverter 113. Again, the amount of delay time is a function of the capacitance of capacitor 114 and the strength of inverter 113 driving capacitor 114. Alternatively, delay cells may be constructed using a chain of inverters such the delay cell shown in FIG. 3E. The delay of the delay cell shown in FIG. 3E is a function of the number and strength of inverters 113 used to construct the delay cell. Generally, longer delays are associated with weaker inverters and/or a large number of inverters, while shorter delays are associated with stronger inverters and/or a smaller number of inverters.

It should be understood, however, that delay cells shown in FIGS. 3C-3E are just a few examples of many possible delay cell architectures that may be used in embodiments of the present invention. In alternative embodiments, other structures may be used. For example, delay cell 110 may be implemented by using other delay structures may be used such as chains of buffers, RC networks, and the like. In some embodiments, a combination of different delay structures may be combined to implement a delay cell.

Figure 3F:
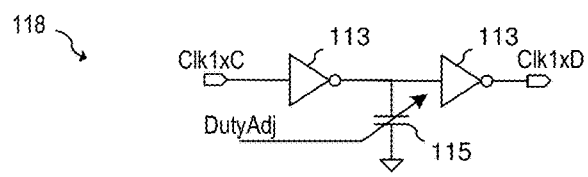

FIG. 3F illustrates an adjustable delay circuit 118 that may also be used to implement adjustable delay circuit 104 in FIG. 3A. As shown, adjustable delay circuit 118 includes an inverter 113 loaded by variable capacitor 115 and buffered by a second inverter 113. The delay of the adjustable delay circuit 118 may be programmed by adjusting the capacitance of variable capacitor 115 based on a value of duty cycle adjustment signal DutyAdj. In some embodiments, variable capacitor 115 may be implemented using a plurality of switched capacitors. Thus, the delay of adjustable delay circuit 118 can be increased by coupling in more capacitors of the plurality of capacitors to inverters 113, and the delay can be reduced by coupling fewer capacitors of the plurality of capacitors to inverters 113. In alternative embodiments of the present invention, variable capacitor 115 may be implemented using other adjustable capacitance circuits known in the art, such as a varactor.

In some embodiments, a plurality of the adjustable delay circuit 118 may be coupled in series. In further embodiments, adjustable delay circuit 118 may be used to implement individual delay cells 110 shown in FIG. 3B, such that the delay of adjustable delay circuit 104 is programmable both by adjusting the capacitance of variable capacitor 115 and by selecting one or more delay cells 110 via multiplexer 111.

Figure 3G:
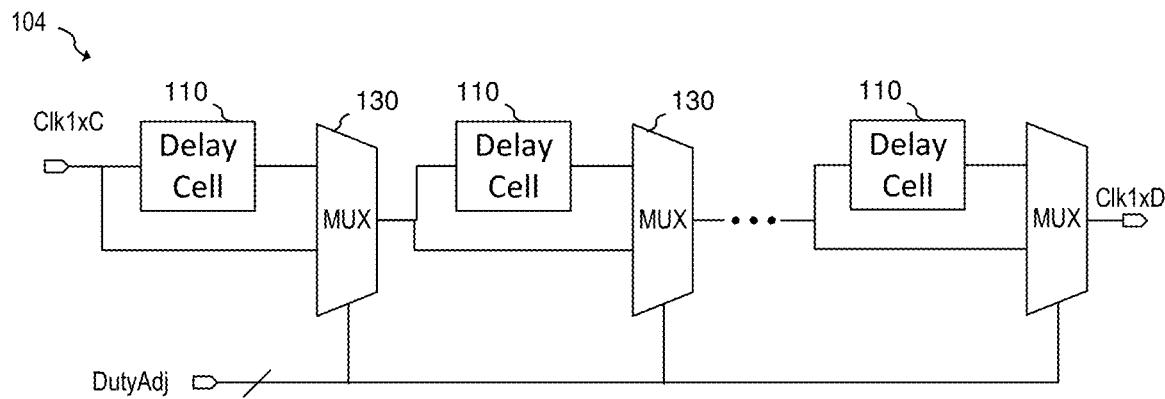

FIG. 3G illustrates a schematic of adjustable delay circuit 104 according to an alternative embodiment of the present invention. As shown, adjustable delay circuit 104 includes a plurality of delay cells 110 coupled in series with each other and separated by multiplexers 130 that are configured to selectively bypass its associated delay cell 10 according to a select signal provided by duty cycle adjustment signal DutyAdj. Thus, for a longer programmed delay, more selectable delay cells 110 are switched into the signal path using multiplexers 130; for a shorted programmed delay, fewer delay cells 110 are switched into the signal path using multiplexers 130. In various embodiments, adjustable delay circuit 104 may contain any number of stages containing delay cell 110 and multiplexer 130. The number of stages and the amount of time delay that each delay cell 10 is capable of producing may vary depending on the particular an embodiment and its specifications. For example, systems having higher clock frequencies may require less delay and fewer delay cells than systems having lower clock frequencies. In some embodiments, adjustable delay circuit 118 shown in FIG. 3F may be used to implement delay cell 110.

Figure 3H:
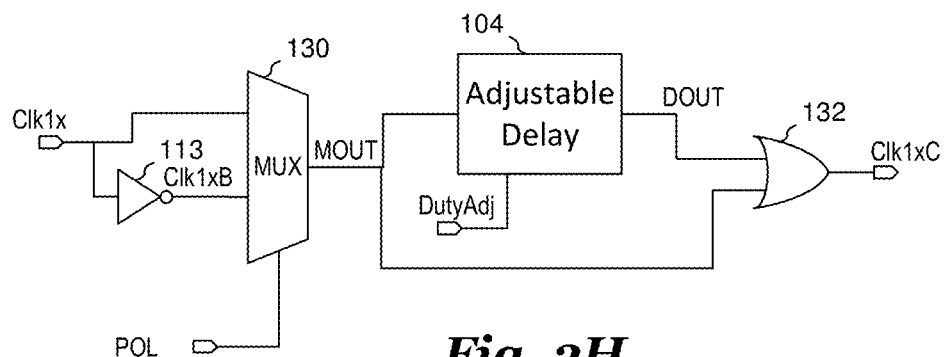

FIG. 3H illustrates a duty cycle correction circuit 102 that may be used to implement duty cycle correction circuit 102 shown in FIG. 3A. As shown, the duty cycle correction circuit includes inverter 113, multiplexer 130, adjustable delay circuit 104 and OR gate 132. During operation, multiplexer selects either the clock input signal at node Clk1$x$, or the inverse of the clock input signal in produced by inverter 130 at node Clk1$x$B according to multiplexer select signal POL. This polarity signal determines the polarity of the output node Clk1$x$C of the duty cycle correction circuit, as well as which portion of the clock input signal at node Clk1$x$B is adjusted. For example, when the clock input signal at node Clk1$x$ is selected, the time during which the clock input signal at node Clk1$x$ is high is adjustable by extending time period $t_H$ of the clock input signal at node Clk1$x$. On the other hand, when input signal Clk1$x$B is selected, the time during which the clock input signal at node Clk1$x$ is low is adjustable by extending time period $t_L$ of the clock input signal at node Clk1$x$.

During operation, the output of multiplexer MOUT is delayed by adjustable delay circuit 104 to form delayed signal DOUT. Delayed signal DOUT is ORed with multiplexer output MOUT using OR gate 132 to form the duty cycle corrected signal at output node OUT. As the delay of adjustable delay circuit 104 is increased, the time during which a clock signal present on output node OUT is high increases. Conversely, as the delay of adjustable delay circuit 104 is decreased, the time during which a clock signal present on output node OUT is high decreases. In various embodiments, adjustable delay circuit 104 may be implemented as described above with respect to FIGS. 3B-3G.

Figure 3I:
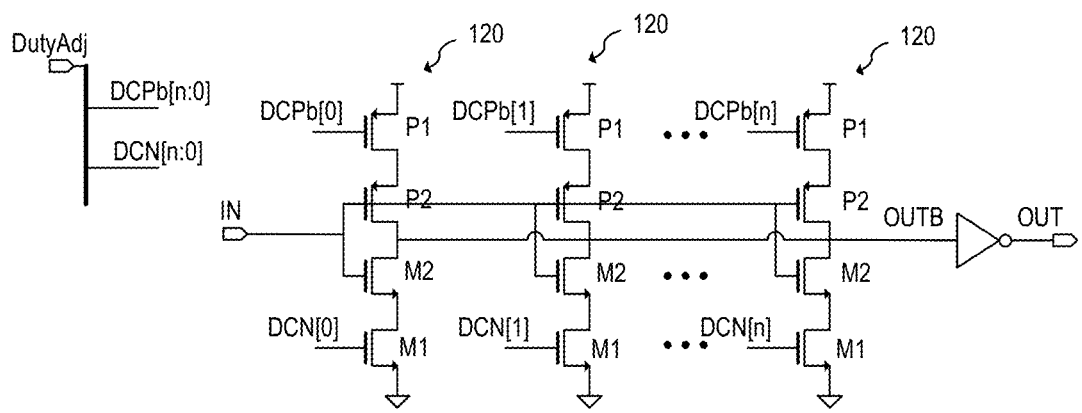

In alternative embodiments, duty cycle correction circuit 102 may be implemented differently. For example, FIG. 3I illustrates a duty cycle correction circuit that may also be used to implement duty cycle correction circuit 102 shown in FIG. 3A. As shown, duty cycle correction circuit 102 includes a plurality of inverters 120 coupled in parallel with each other. That is, the input to each inverter 120 is connected to input node IN and the output of each inverter 120 is connected to output node OUTB. As shown, each inverter 120 includes NMOS devices M1 and M2 and PMOS devices P2 and P1 coupled in series with each other. NMOS device M2 and PMOS device P2 each have gates connected to input node IN and load paths coupled to output node OUTB. The gates of NMOS devices M1 of inverters 120 are respectively coupled to digital select signals DCPN[n:0] and the gates of PMOS devices P1 are respectively coupled to digital select signals DCPb[n:0]. Thus, during operation, one or more of NMOS transistors M1 and PMOS transistors P1 are selectively activated in order to adjust the relative strengths of the PMOS pull-up path and the NMOS pull-down path of inverters 120. For example, in cases where the rising edge of first clock signal Clk1x needs to be delayed, fewer PMOS transistors P1 may be selected in order to slow-down or delay the rising edge produced by duty cycle correction circuit 102, while more NMOS devices M1 may be selected to maintain a falling edge with less delay. Similarly, in cases where the falling edge of first clock signal Clk1x needs to be delayed, fewer NMOS transistors M1 may be selected in order to slow down or delay the falling edge produced by duty cycle correction circuit 102, while more PMOS devices P1 may be selected to maintain a rising edge with less delay. Inverter 122 may be coupled to the output of inverters 120 to buffer the output of inverters 120. In various embodiments, the size of transistors M1, M2, P1 and M2 may be the same or different in each of inverters 120.

It should be understood that the implementation examples of frequency doubling circuit 12 shown in FIGS. 3A-3I are just a few example of many possible embodiment implementations of frequency doubling circuit 12. In alternative embodiments, other circuits and methods may be used to achieve the same or similar functionality.

Figure 4A:
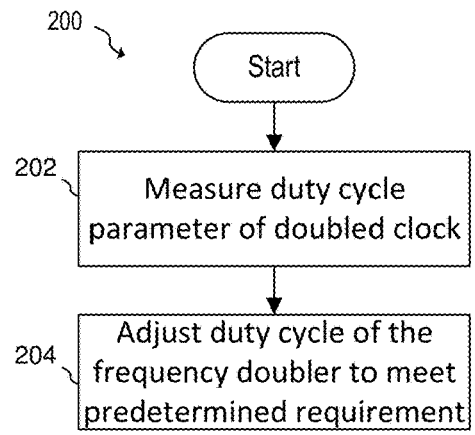
FIGS. 4A and 4B illustrate block diagrams of embodiment methods of calibrating a frequency doubler circuit.

FIG. 4A illustrates method 200 of calibrating frequency doubler circuit 12 according to the embodiment of FIG. 1A. In step 202, the duty cycle parameter of second clock signal Clk2x is measured using duty cycle measurement and adjustment circuit 16. In various embodiments, the duty cycle parameter of second clock signal Clk2x may be directly measured using high-speed counters or other duty cycle measurement techniques known in the art. In step 204, the duty cycle of first clock signal Clk1x and/or second clock signal Clk2x is adjusted until the determined duty cycle is 50% or within a predetermined tolerance of 50%, or the duty cycle of first clock signal Clk1x is adjusted until differences in adjacent clock periods is within a predetermined tolerance. In some embodiments, the determined duty cycle parameter is compared to a threshold duty cycle parameter and method 200 shown in FIG. 4A is iteratively performed until the measured duty cycle parameter meets the predetermined requirement.

Figure 4B:
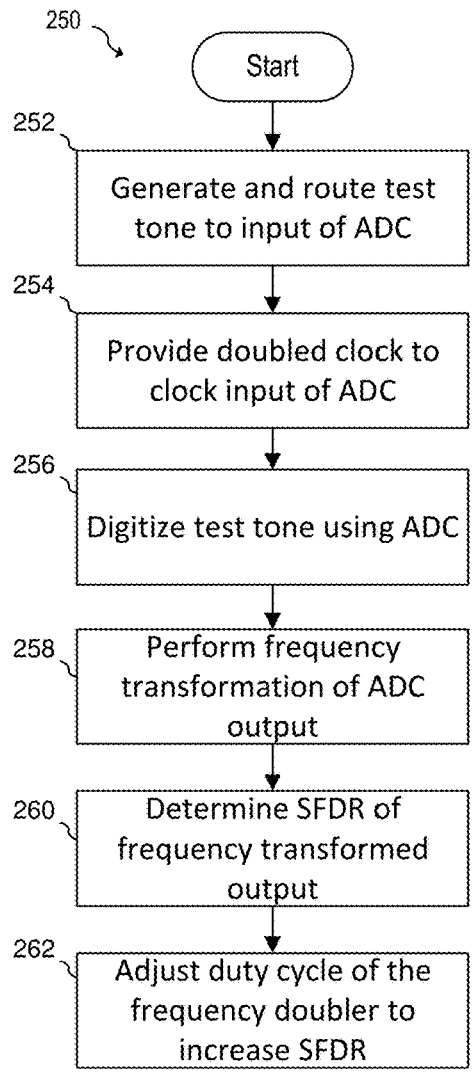

FIG. 4B illustrates method 250 of calibrating frequency doubler circuit 12 according to the embodiment of FIG. 1B. In step 252, a test tone is generated by test tone generator 54 and routed to the input of duty cycle sensitive analog-to-digital converter 56. The frequency of the tone generated by test tone generator 54 can vary depending on the particular system and its specifications. In one embodiment the frequency of the tone generated by test tone generator 54 is 1 MHz, however, other frequencies may be used in other embodiments.

In step 254, second clock signal Clk2x produced by frequency doubler 12 is provided as a clock signal to duty cycle sensitive analog-to-digital converter 56 that is sensitive to duty cycle variations in first clock signal Clk1x or second clock signal Clk2x. In step 256, duty cycle sensitive analog-to-digital converter 56 is operated in a manner such that the test tone produced by test tone generator 54 is digitized, and the digital output is sent to duty cycle analysis and adjustment circuit 58. In step 258, a frequency transformation is performed on the digitized tone transform the digitized signal from the time domain to the frequency domain to form a frequency domain signal. In some embodiments, this frequency transformation is a FFT, however in alternative embodiments of the present invention other frequency transformation algorithms may be used, such as, but not limited to a discrete Fourier transform, discrete cosine transform (DCT), or other or other transform types known in the art. In some embodiments, a windowing function may be applied to the digitized tone prior to performing the frequency transformation. In step 260, the SFDR of the frequency-transformed signal is determined. In some embodiments, the determination of the SFDR is accomplished by determining a difference in amplitude between the frequency bin corresponding to the frequency of the test tone and a frequency bin corresponding to a spur caused by asymmetries in the duty cycle of second clock signal Clk2x. As described above, in some embodiments this spur frequency may be $f_{spur}=f_s/2-f_{in}$. In other embodiments, the spur frequency may be different depending on the details of the particular implementation and its specifications. Alternatively, the SFDR may be calculated by determining a difference between the power of the signal in the frequency bin corresponding to the test tone and the sum of the power in the remaining frequency bins.

In step 262 the duty cycle of first clock signal Clk1x and/or second clock signal Clk2x is adjusted until the determined SFDR is minimized or is within a predetermined range. In some embodiments, the determined SFDR is compared to a threshold and method 250 shown in FIG. 4A is iteratively performed until the SFDR meets the predetermined requirement.

It should be understood that in methods 200 and 250 described above, the duty cycle of the first clock signal Clk1x, the duty cycle of the second clock signal Clk2x, or both the duty cycle of the first clock signal and the duty cycle of the second clock signal may be adjusted. In some embodiments, the adjustment of the duty cycle of the first clock signal Clk1x and the duty cycle of the second clock signal Clk2 are performed sequentially. For example, in one embodiment, methods 200 and/or 250 are performed to first correct the duty cycle of first clock signal Clk1x, and then correct the duty cycle of second clock signal Clk2x. In other embodiments, methods 200 and/250 are performed to first correct the duty cycle of second clock signal Clk2x, and then correct the duty cycle of first clock signal Clk1x.

Figure 5A:
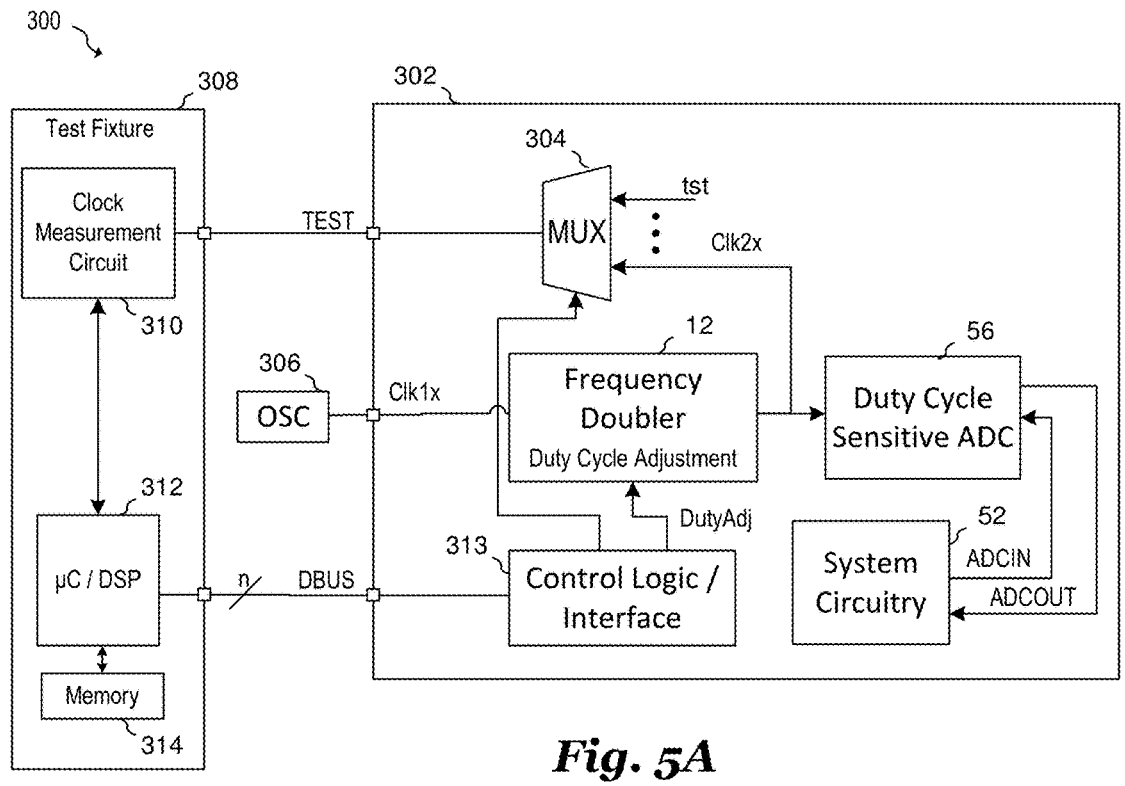
FIGS. 5A-5D illustrate schematics of a system that incorporates an embodiment frequency doubler circuit.

FIG. 5A illustrates system 300 that includes integrated circuit 302 coupled to test fixture 308. System 300 is similar to system 10 shown in FIG. 1A in that frequency doubler circuit 12 is calibrated by directly measuring the doubled clock signal. As shown, integrated circuit 302 includes frequency doubler circuit 12, duty cycle sensitive analog-to-digital converter 56, system circuitry 52, test multiplexer 304, and control logic interface circuitry 313. In various embodiments, system circuitry 52 is representative of any type of system circuit that produces a signal for measurement by duty cycle sensitive analog-to-digital converter 56. System circuitry 52 may include, for example, RF circuitry, sensor circuitry, audio circuitry, or any other circuitry that can be integrated on an integrated circuit. In alternative embodiments of the present invention, the various components disposed on integrated circuit 302 may be partitioned in a different manner. For example, one or more components of integrated circuit 302 may be disposed on a plurality of integrated circuits or may be implemented on a circuit board. System 300 also includes oscillator 306, which generates first clock signal Clk1x. In various embodiments, oscillator 306 may be a crystal oscillator or other type of oscillator capable of generating a clock signal. In some embodiments, system 300 may be configured such that oscillator 306 is a crystal and the active circuitry used to drive the crystal (not shown) resides on integrated circuit 302.

Control logic and interface circuitry 313 includes logic that controls the states of some or all of the various components on integrated circuit 302, and includes digital interface circuitry configured to communicate with external components via a digital bus DBUS. In various embodiments, the digital interface of control logic and interface circuitry 313 may be a serial bus interface circuit, a parallel bus interface circuit, and/or may comply with any bus standard including, but not limited to SPI, CAN, I2C, LVDS, and USB. Accordingly, the number n of signal pins of digital bus DBUS may be any number appropriate to the implemented bus protocol.

Test fixture 308 may be coupled to integrated circuit 302 when frequency doubler circuit 12 is being calibrated. For example, test fixture 308 may be coupled to integrated circuit 302 during wafer testing, package testing, manufacturing testing or during routine maintenance or calibration operations. Test fixture 308 may be implemented, for example, using a wafer test fixture, packaging test fixture, or any other system that is configured to be coupled to integrated circuit 302 for the purpose of testing. In some embodiments, the functionality of test fixture 308 may reside in the same system as integrated circuit 302. As shown, test fixture 308 includes clock measurement circuit 310, processor 312 and memory 314. Clock measurement circuit 310 is configured to be coupled to integrated circuit 302 via a test interface signal line TEST. As shown, test interface signal line TEST is coupled to the output of multiplexer 304 on integrated circuit 302. During operation, control logic and interface circuitry 313 selects various signals to be output to test interface signal line TEST. Among these selectable signals is second clock signal Clk2x, which is the frequency doubled clock signal. It should be understood that multiplexer 304 may select from among any number of selectable signals within integrated circuit 302. However, in some embodiments, the multiplexer 304 may be omitted and second clock signal Clk2x may be directly routed to test interface signal line TEST.

During testing calibration, clock measurement circuit 310 monitors second clock signal Clk2x and performs a duty cycle parameter measurement. In some embodiments, this duty cycle parameter measurement is transmitted to processor 312. Based on this duty cycle parameter measurement, processor 312 adjusts the duty cycle of frequency doubler circuit 12 by issuing commands to control logic interface circuit 313 via digital bus DBUS. In some embodiments, the monitoring of the duty cycle measured by clock measurement circuit 310 and the adjustment of the duty cycle of frequency doubler circuit 12 is functionally accomplished by executing a program that resides in memory 314. In some embodiments, memory 314 may be used to store a plurality of duty cycles measured by clock measurements circuit 310, as well as a plurality of corresponding duty cycle adjustment settings. Thus, during operation, processor 312 can select duty cycle adjustment settings that meet a predetermined duty cycle parameter requirement.

In some embodiments, processor 312 may be implemented using a microcontroller or other processing circuit known in the art. In alternative embodiments of the present invention, the duty cycle monitoring and duty cycle adjustment functionality described above may be implemented using dedicated logic such as a state machine. In some embodiments, processor 312 also includes digital signal processing circuitry that is used to assist with the determination of the duty cycle monitored by clock measurements circuit 310. For example, in some embodiments, clock measurement circuit 310 includes an analog-to-digital converter that provides a digital data stream to processor 312. In such embodiments, processor 312 receives the data stream produced by clock measurements circuit 310 and determines the duty cycle parameter of second clock signal Clk2x using one or more digital signal processing algorithms.

Embodiment digital signal processing algorithms may include, for example, performing a frequency transformation, such as an FFT, on second clock signal Clk2x, and measuring the spurious behavior of second clock signal Clk2x. In one embodiment, the duty cycle parameter corresponding to the duty cycle of second clock signal Clk2x is the second harmonic of clock signal Clk2x. Thus, the difference in amplitude between a frequency bin at the frequency of second clock signal Clk2x and a frequency bin at the second harmonic of second clock signal Clk2x is changes according to the duty cycle of second clock signal Clk2x. The closer the duty cycle of second clock signal Clk2x to 50%, the larger the difference in amplitude between these frequency bins.

In some embodiments, the duty cycle parameter corresponding to the duty cycle of the first clock signal is the amplitude of a spur at one-half the clock frequency of second clock signal Clk2x. This assumes that the clock period of second clock signal Clk2x changes every other clock period. Thus, the difference in amplitude between a frequency bin at the frequency of second clock signal Clk2x and a frequency bin at one-half of the frequency of second clock signal Clk2x changes according to the duty cycle of first clock signal Clk1x. The closer the duty cycle of first clock signal Clk1x to 50%, the larger the difference in amplitude between these frequency bins. In alternative embodiments, other digital signal processing algorithms known in the art may be used to determine the duty cycle parameter.

Figure 5B:
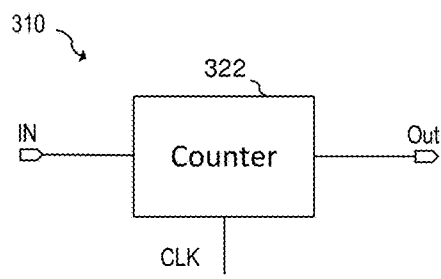

FIG. 5B illustrates one circuit that could be used to implement clock measurement circuit 310. In one embodiment, clock measurement circuit 310 includes a counter 322 that monitors the time during which second clock signal Clk2x is high and/or low. This time measurement can be accomplished, for example, by incrementing counter 322 when second clock signal Clk2x is in a high and/or low state. The result of this count can be transmitted to processor 312, which may be configured to determine the duty cycle of second clock signal Clk2x based on a comparison of the number of counts that second clock signal Clk2x is in the high state (high count) and the number of counts that second clock signal Clk2x is in the low state (low count). When these counts are equal, the measured duty cycle is considered to be 50%. The degree to which these counts are not equal is related to the deviation from an ideal 50% duty cycle. In some embodiments, the difference between the high count and the low count may be used as a duty cycle metric for the purpose of adjusting the duty cycle of frequency doubler circuit 12.

In alternative embodiments, different metrics may be used. For example, in another embodiment, counter 322 may be incremented when second clock signal Clk2$x$ is in a first state (e.g., high or low) and not incremented or decremented when second clock signal Clk2$x$ is in a second state (e.g., low or high). A resulting count after a predetermined prior of time may be used as a parameter that represents the duty cycle of second clock signal Clk2$x$.

The duty cycle parameter as it relates to first clock signal Clk1$x$ may be determined by measuring the length of consecutive clock periods of second clock signal Clk2$x$ using counter 322. Thus, the duty cycle of first clock signal Clk1$x$ approaches 50% as two consecutive clock periods become closer in length to each other.

Figure 5C:
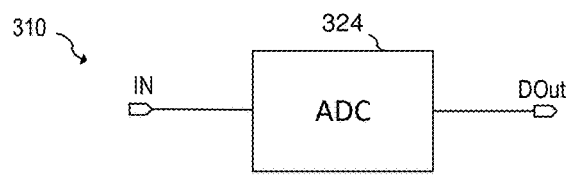

FIG. 5C represents another manner in which clock measurement circuit 310 may be implemented. In an embodiment, clock measurement circuit 310 may be implemented using analog-to-digital converter 324. In such an embodiment, analog-to-digital converter 324 digitizes second clock signal Clk2$x$ and transmits the converted digital value to processor 312. Processor 312 may, in turn, perform a frequency transformation of the converted digital value, determine a spurious free dynamic range, and adjust the duty cycle of frequency doubler circuit 12 on the basis of the determined spurious free dynamic range.

Figure 5D:
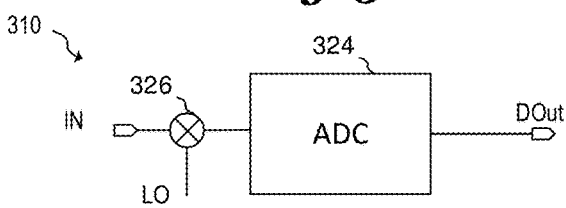

FIG. 5D illustrates a further circuit that may be used to implement clock measurements circuit 310. As shown, clock measurements circuit 310 may be implemented using analog-to-digital converter 324 and mixer 326. Mixer 326 may be used, for example, to downconvert the clock signal to a lower frequency such that a lower sampling rate may be used for analog-to-digital converter 324. In some embodiments, the frequency of the local oscillator signal LO used to drive mixer 326 may be set to down convert a spurious signal that is significantly affected by the duty cycle of second clock signal Clk2$x$. Similar to the embodiment of FIG. 5C, the digitized output of analog-to-digital converter 324 is analyzed using processor 312 to perform a frequency conversion, such as an FFT, and comparing the relative magnitudes of the downconverted clock signal and the downconverted spurious response. The difference in these relative magnitudes may be used as a basis for adjusting the duty cycle of frequency doubler circuit 12. In various embodiments, analog-to-digital converter 324 may be implemented using any type of analog-to-digital converter architecture appropriate to the particular application and the particular monitored clock frequencies. In some embodiments analog-to-digital converter 324 may be implemented using the Sigma Delta analog-to-digital converter, a pipeline analog-to-digital converter, a flash analog to digital converter, or other type of analog-to-digital converter. Mixer 326 may be implemented using mixer circuits known in the art. It should be understood that the examples of FIGS. 5B-5D are just three examples of many types of circuits that can be used to measure the duty cycle of second clock signal Clk2$x$. In alternative embodiments of the present invention, other circuits known in the art may be used.

Figure 5E:
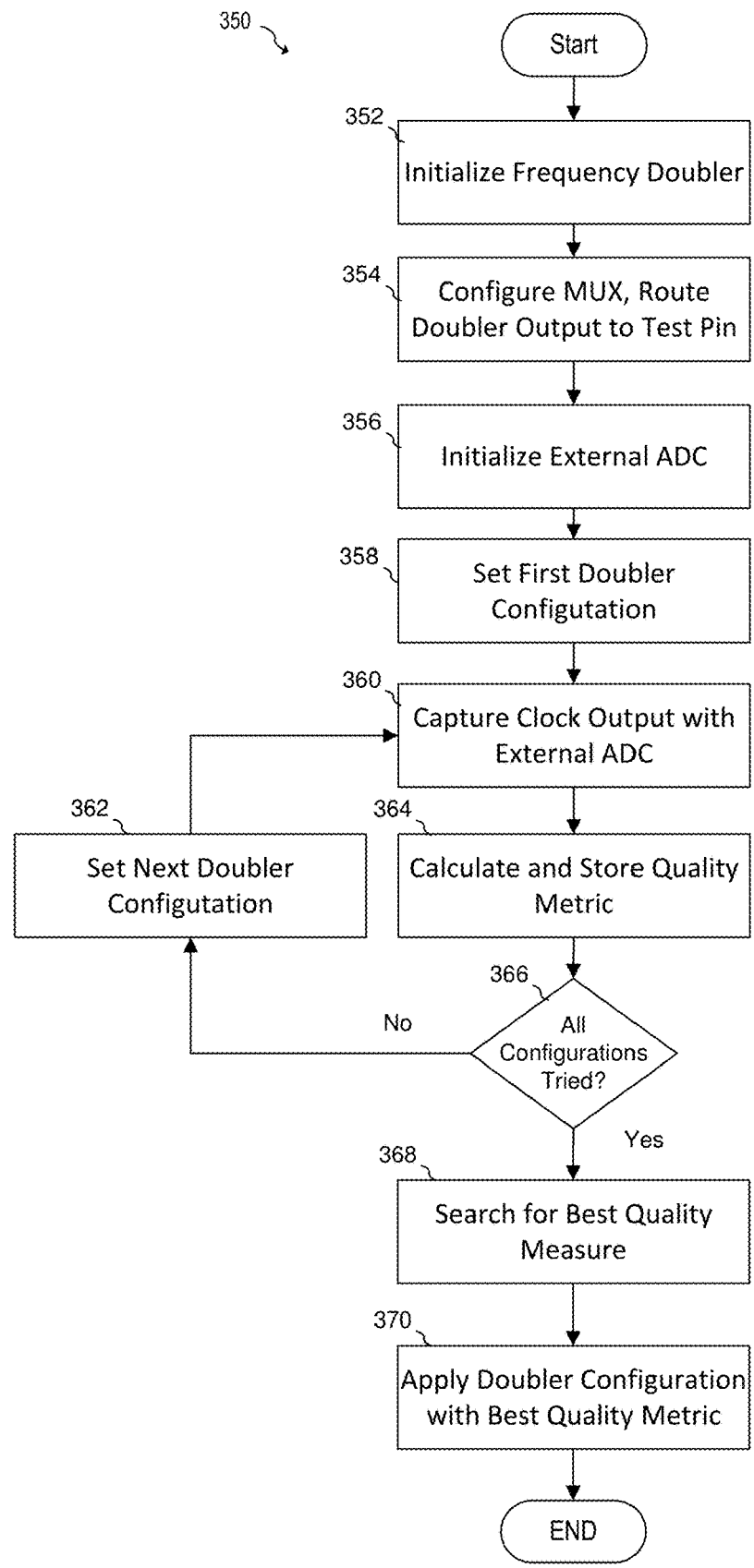
FIG. 5E illustrates a block diagram of an embodiment method of calibrating the system of FIG. 5A.

FIG. 5E illustrates a method 350 of calibrating the duty cycle of frequency doubler circuit 12 of system 300 shown in FIG. 5A. In step 352, frequency doubler circuit 12 is initialized. This initialization may include, for example, configuring the various delay settings (also referred to as duty cycle settings) within frequency doubler circuit 12 to predetermined values. In some embodiments, initializing frequency doubler circuit 12 may include writing these predetermined values to a local register or memory resident on the system or integrated circuit 302 in which frequency doubler circuit 12 resides. In one example, processor 312 may send the configuration command to control logic and interface circuitry 313 via a digital bus DBUS. This configuration command may be, for example, a single command within a control word, or a register write command that is addressed to the particular register and/or registers devoted to the delay settings of frequency doubler circuit 12.

In step 354, second clock signal Clk2$x$ is configured to be routed to clock measurement circuit 310 on test fixture 308. In an embodiment, second clock signal Clk2$x$ is routed to clock measurements circuit 310 by configuring multiplexer 304 to route second clock signal Clk2$x$ two external test pin TEST. Next, clock measurement circuit 310 is initialized in step 356. In some embodiments, such as the embodiments of FIGS. 5C and 5D, analog-to-digital converter 324 residing within clock measurement circuit 310 is initialized. This initialization may include, for example, the activation of analog-to-digital converter 324 and/or routing the input coupled to signal TEST to the input of analog-to-digital converter 324.

In step 358, frequency doubler circuit 12 may be configured according to a first doubler configuration. This first doubler configuration may include, for example, a first predetermined set of delay settings for frequency doubler circuit 12. In some embodiments, step 358 is performed in conjunction with step 352 as described above. In step 360, second clock signal Clk2$x$ is captured by clock measurements circuit 310. In some embodiments, the capturing of second clock signal Clk2$x$ is performed by digitizing second clock signal Clk2$x$ using analog-to-digital converter 324 as shown in FIGS. 5C and 5D. In embodiments that utilize frequency transformations, such as an FFT, the capturing of second clock signal Clk2$x$ may be accomplished by digitizing the predetermined number of samples. In some embodiments, this predetermined number of samples may be a power of two. For example, 512, 1024, 2048, or 4096 samples may be digitized by analog-to-digital converter 324. In alternative embodiments of the present invention, other powers of two or even a number of samples that is not a power of two may be captured according to the particular system and its specifications. In some embodiments, a window function may be applied to the digitized samples. Such window functions may include, but are not limited to, a rectangular window, a triangular window, a cosine-sum window a Hann window, a Hamming window, a Blackman window as well as other windows known in the art. In some embodiments, the application of such a window may reduce spectral leakage and improve the accuracy of spectral measurements.

In step 364, a quality metric is calculated and stored. Such a quality metric may be calculated as described according to the embodiment of FIG. 4A. For example, the duty cycle of second clock signal Clk2$x$ and/or clock period variation of second clock signal Clk2$x$ may be measured directly according to the digitized output. Alternatively, the spurious free dynamic range of the frequency transformed digitized output may be determined by determining a difference between a tone corresponding to the frequency of second clock signal Clk2$x$ and a spur corresponding to the distortion caused by a duty cycle error within second clock signal Clk2$x$. In some embodiments, the SFDR is determined by determining a difference between a power of a tone in a frequency bin corresponding to the frequency of second clock signal Clk2x and the sum of the power of one or more other frequency bins. Alternatively, other performance metrics may be used. In some embodiments, the calculated quality metric is stored in a memory or register. In some embodiments, the calculated quality metric is stored in memory 314 within test fixture 308. Alternatively, the calculated quality metric may be stored in a memory or register disposed on integrated circuit 302.

In step 366, a determination is made as to whether all configurations of frequency doubler circuit 12 have been evaluated. In some embodiments, all possible configurations of frequency doubler circuit 12 are evaluated. In alternative embodiments a subset of all configurations of frequency doubler circuit 12 are evaluated. In yet other embodiments, a search algorithm such as a binary search or a linear search is performed until the calculated quality metric meets predetermined criteria such as a predetermined duty cycle or predetermined spurious free dynamic range. If the condition of step 366 is not satisfied, then a further configuration of frequency doubler circuit 12 is provided (step 362). Once all configurations are provided, the method continues to step 368.

In step 368, a search is performed for the best quality measure. In some embodiments, each calculated quality metric is compared with each other and the doubler configuration corresponding to the best quality metric is selected to configure frequency doubler circuit 12 during normal operation. In other embodiments, the search is performed until the calculated quality metric is within a predetermined range. In some embodiments, step 368 is performed iteratively along with capturing the clock output in step 360 and the calculation and storage of the quality metric in step 364. The frequency doubler configuration with the best quality metric is then applied to frequency doubler circuit 12 in step 370. In some embodiments this frequency doubler configuration is written into a register or memory coupled to frequency doubler circuit 12.

Figure 6A:
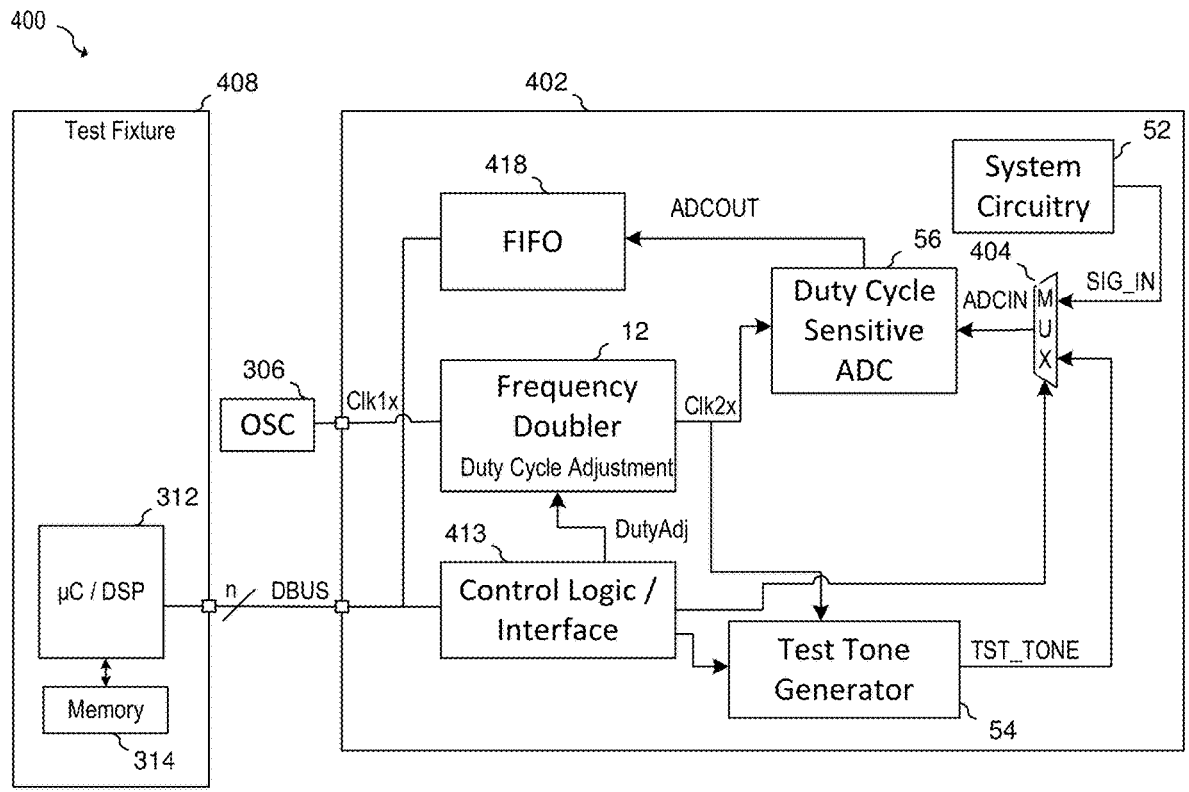
FIGS. 6A-6C illustrate schematics of a system that incorporates an embodiment frequency doubler circuit.

FIG. 6A illustrates system 400 that includes integrated circuit 402 coupled to test fixture 408. System 400 is similar to system 10 shown in FIG. 1B in that frequency doubler circuit 12 is calibrated by monitoring the output of duty cycle sensitive analog-to-digital converter 56 and determining a quality metric (such as a spurious-free dynamic range) that is dependent on the duty cycle of first clock signal Clk1x and/or second clock signal Clk2x. As shown, integrated circuit 402 includes frequency doubler circuit 12, duty cycle sensitive analog-to-digital converter 56, system circuitry 52, test multiplexer 404, control logic and interface circuitry 413, test tone generator 54 and first-in first-out (FIFO) memory 418. During calibration, control logic and interface circuitry 413 activates test tone generator 54, the output of which is routed to the input of duty-cycle sensitive analog-to-digital converter 56 via test multiplexer 404. The output ADCOUT of analog-to-digital converter 56 is buffered by FIFO 418, and the output of FIFO 418 is transmitted via digital bus DBUS to controller 312, which determines the quality metric, for example, by performing a frequency transformation, such as an FFT, and determining an SFDR based on the frequency transformed output, as described above with respect to FIG. 4B.

Based on the determined quality metric, processor 312 adjusts the duty cycle of frequency doubler circuit 12 by issuing commands to control logic interface circuit 413 via digital bus DBUS. In some embodiments, the calculation of the quality metric and the adjustment of the duty cycle of frequency doubler circuit 12 is functionally accomplished by executing a program that resides in memory 314. In some embodiments, memory 314 may be used to store a plurality of quality metrics determined by processor 312, as well as a plurality of corresponding duty cycle adjustment settings. Thus, during operation, processor 312 can select duty cycle adjustment settings that meet a predetermined quality metric.

In alternative embodiments of the present invention, the various components disposed on integrated circuit 402 may be partitioned in a different manner. For example, one or more components of integrated circuit 402 may be disposed on a plurality of integrated circuits or may be implemented on a circuit board. System 400 also includes oscillator 306, which generates first clock signal Clk1x. In various embodiments, oscillator 306 may be a crystal oscillator or other type of oscillator capable of generating a clock signal. In some embodiments, system 400 may be configured such that oscillator 306 is a crystal and the active circuitry used to drive the crystal (not shown) resides on integrated circuit 402.

Control logic and interface circuitry 413 includes logic that controls the states of some or all of the various components on integrated circuit 402, and includes digital interface circuitry configured to communicate with external components via a digital bus DBUS. In various embodiments, the digital interface of control logic and interface circuitry 413 may be a serial bus interface circuit, a parallel bus interface circuit, and/or may comply with any bus standard including, but not limited to SPI, CAN, I2C, LVDS, and USB. Accordingly, the number n of signal pins of digital bus DBUS may be any number appropriate to the implemented bus protocol.

Test fixture 408 may be coupled to integrated circuit 402 at times during which frequency doubler circuit 12 is being calibrated. For example, test fixture 408 may be coupled to integrated circuit 402 during wafer testing, package testing, manufacturing testing or during routine maintenance or calibration operations. Test fixture 408 may be implemented, for example, using a wafer test fixture, packaging test fixture, or any other system that is configured to be coupled to integrated circuit 402 for the purpose of testing. In some embodiments, the functionality of test fixture 408 may reside in the same system as integrated circuit 402.

Figure 6B:
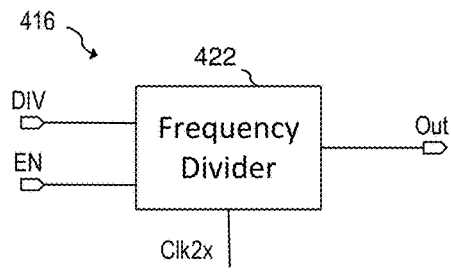

FIG. 6B illustrates one circuit that could be used to implement test tone generator 54 in accordance with an embodiment. As shown, test tone generator 54 includes a frequency divider 422 that can be implemented using frequency divider circuits known in the art. During operation, frequency divider 422 divides second clock signal Clk2x down to a lower frequency. In one embodiment, the frequency produced by frequency divider 422 is about 1 MHz as described above with respect to the embodiment of FIG. 4B. Alternatively, other frequencies may be generated depending on particular system and its specifications. In some embodiments, the frequency division ratio of frequency divider 422 may be programmable according to a frequency division ratio DIV provided as an input to frequency divider 422. In some embodiments, the operation of frequency divider 422 may be enabled by control logic interface 413 via signal pin EN. In some embodiments, frequency divider 422 is configured to divide second clock signal Clk2x by at least a factor of two using only the rising edge or only the falling edge of second clock signal Clk2x. In such embodiments, a 50% duty cycle of the produced test tone can be ensured even when the duty cycle of second clock signal Clk2x is not 50%.

In some embodiments, frequency divider 422 is implemented using ripple counter or a synchronous counter having one or more registers. In other embodiments, frequency divider 422 may be implemented using various prescaler circuits and systems known in the art.

Figure 6C:
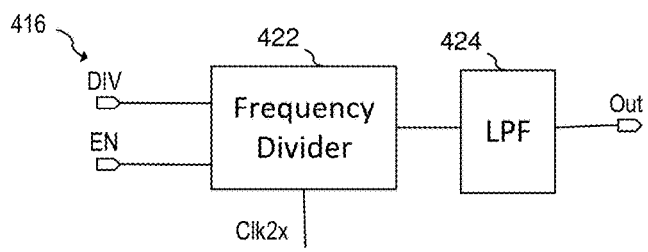

In some embodiments, the output of frequency divider 422 is low pass filtered in order to attenuate or remove harmonics, as shown in FIG. 6C, which illustrates low-pass filter 424 coupled to the output of frequency divider 422. Low-pass filter 424 may be implemented using analog low-pass filter circuits known in the art. For example, in some embodiments, low-pass filter 424 may be implemented using a simple single pole RC filter using a series resistor and a shunt capacitor. Higher order passive filters; well as passive LC and/or RLC filters may also be used. In other embodiments, more complex filter topologies may be used. For example, an active filter having one or more implementing one or more poles may be used. Such an active filter may be implemented, for example, using opamp-based filter structures, transconductance amplifier based filter structures (such as gmC filters) or other active filter structures known in the art. In some embodiments, low-pass filter 424 is coupled between the output of test multiplexer 404 and the input to duty cycle sensitive analog-to-digital converter 56. In such embodiments, low-pass filter 424 also serves as an anti-aliasing filter for duty cycle sensitive analog-to-digital converter 56. The bandwidth of low-pass filter 424 may be set to a frequency appropriate to the particular system being implemented. For example, in some embodiments, the cutoff frequency of low-pass filter 424 may be less than one-half the sampling frequency of duty cycle sensitive analog-to-digital converter 56.

Figure 6D:
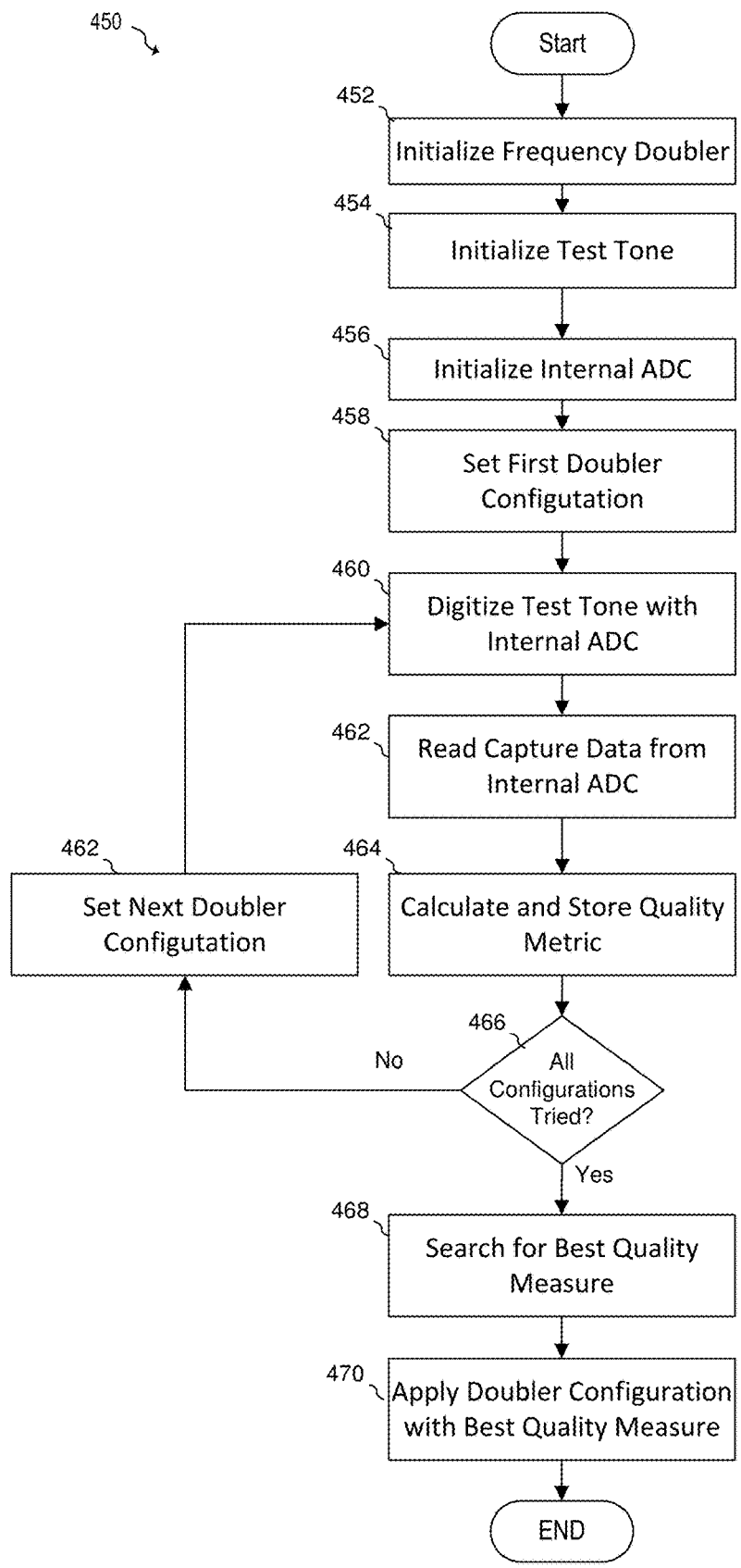
FIG. 6D illustrates a block diagram of an embodiment method of calibrating the system of FIG. 6A.

FIG. 6D illustrates a method 450 of calibrating the duty cycle of frequency doubler circuit 12 of system 400 shown in FIG. 6A. In step 452, frequency doubler circuit 12 is initialized. This initialization may entail, for example, configuring the various delay settings (also referred to as duty cycle settings) within frequency doubler circuit 12 to predetermined values. In some embodiments, initializing frequency doubler circuit 12 may include writing these predetermined values to a local register or memory resident on the system or integrated circuit 402 in which frequency doubler circuit 12 resides. In one example, processor 312 may send the configuration command to control logic and interface circuitry 413 via a digital bus DBUS. This configuration command may be, for example, a single command within a control word, or a register write command that is addressed to the particular register and/or registers devoted to the delay settings of frequency doubler circuit 12.

In step 454, test tone generator 54 is initialized and activated such that a test tone is generated. Next, in step 456 duty cycle sensitive analog-to-digital converter is initialized such that the output of test tone generator 54 is converted to a digital signal on the basis of second clock signal Clk2x. Such an initialization may be performed by configuring test multiplexer 404 to route the output of test tone generator 54 to the input of duty cycle sensitive analog-to-digital converter 56. In step 458, frequency doubler circuit 12 may be configured according to a first doubler configuration. This first doubler configuration may include, for example, a first predetermined set of delay settings for frequency doubler circuit 12. In some embodiments, step 458 is performed in conjunction with step 452 as described above.

In step 460, duty cycle sensitive analog-to-digital converter 56 digitizes the test tone, the output of which is sent to FIFO 418. Next, in step 462, the digitized test tone data stored in FIFO 418 is read by processor 312 in test fixture 408. In some embodiments, one or more samples of the digitized test tone data may be stored in memory 314 on test fixture 408. In some embodiments, a predetermined number of samples may be transferred to processor 312 for each quality metric measurement. In embodiments in which processor 312 performs an FFT on the digitized data, this predetermined number of samples may be a power of two. For example, 512, 1024, 2048, or 4096 samples may be digitized by duty cycle sensitive analog-to-digital converter 56. In alternative embodiments of the present invention, other powers of two or even a number of samples that is not a power of two may be captured according to the particular system and its specifications. In some embodiments, a window function may be applied to the digitized samples. Such window functions may include, but are not limited to, a rectangular window, a triangular window, a cosine-sum window a Hann window, a Hamming window, a Blackman window as well as other windows known in the art. In some embodiments, the application of such a window may reduce spectral leakage and improve the accuracy of spectral measurements.

In step 464, a quality metric is calculated and stored. Such a quality metric may be calculated as described according to the embodiment of FIG. 4B. For example, an FFT may be applied to the digitized tone, and an SFDR may be determined by determining a difference between a power of a tone in a frequency bin corresponding to the frequency of the digitized tone and sum of the power of one or more other frequency bins. Alternatively, other performance metrics may be used. In some embodiments, the calculated quality metric is stored in memory 314 within test fixture 308. Alternatively, the calculated quality metric may be stored in a memory or register disposed on integrated circuit 302.

In step 466, a determination is made as to whether all configurations of frequency doubler circuit 12 have been evaluated. In some embodiments, all possible configurations of frequency doubler circuit 12 are evaluated. In alternative embodiments a subset of all configurations of frequency doubler circuit 12 are evaluated. In yet other embodiments, a search algorithm such as a binary search or a linear search is performed until the calculated quality metric meets predetermined criteria such as a predetermined duty cycle or predetermined spurious free dynamic range. If the condition of step 466 is not satisfied, then a further configuration of frequency doubler circuit 12 is provided (step 462). Once all configurations are provided, the method continues to step 468.

In step 468, a search is performed for the best quality measure. In some embodiments, each calculated quality metric is compared with each other and the doubler configuration corresponding to the best quality metric is selected to configure frequency doubler circuit 12 during normal operation. In other embodiments, the search is performed until the calculated quality metric is within a predetermined range. In some embodiments, step 468 is performed iteratively along with digitizing the test tone in step 460 and the calculation and storage of the quality metric in step 464. The frequency doubler configuration with the best quality metric is then applied to frequency doubler circuit 12. In some embodiments, this frequency doubler configuration is written into a register or memory coupled to frequency doubler circuit 12 in step 470.

Figure 7A:
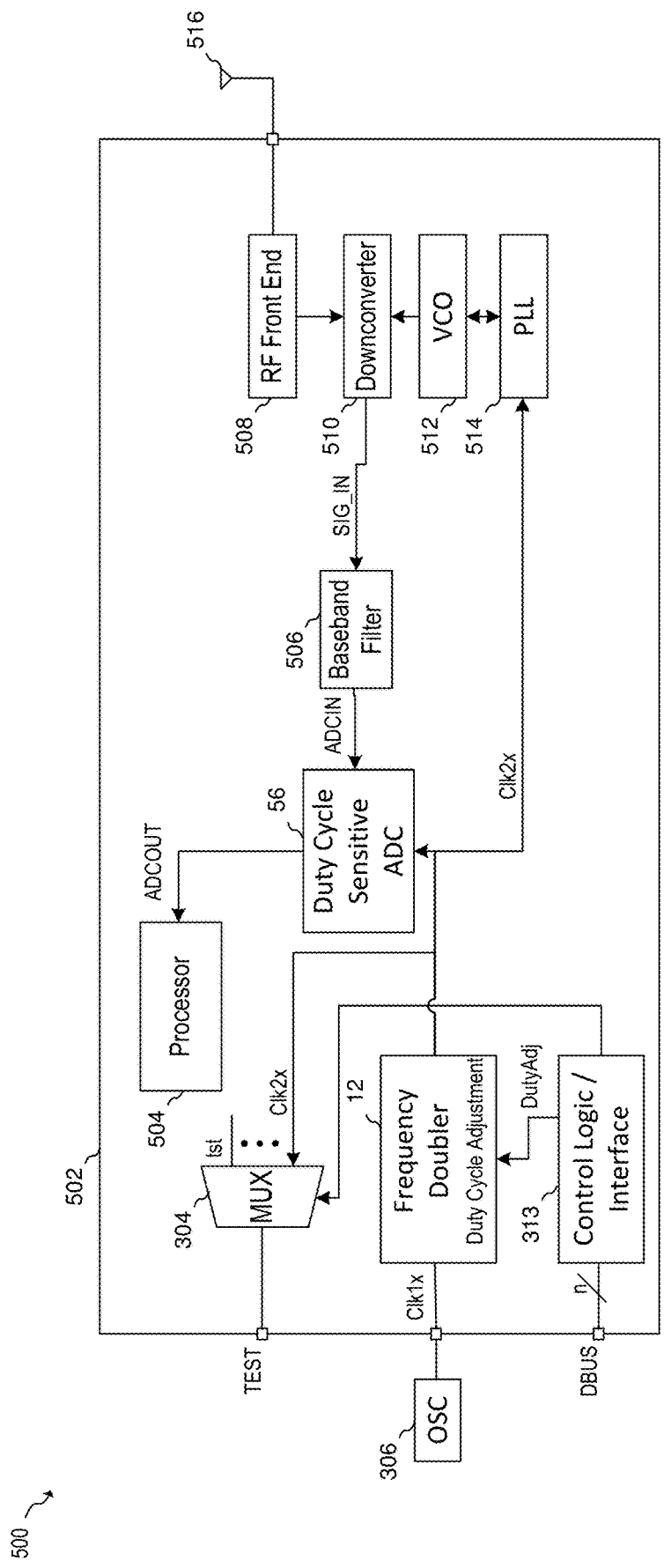
FIGS. 7A and 7B illustrate schematics of embodiment RF systems.

FIG. 7A illustrates an RF system 500 according to an embodiment of the present invention. RF system 500 incorporates the frequency doubler duty cycle adjustment circuitry shown and described with respect to integrated circuit 302 in FIG. 5A with the addition of additional RF circuitry.

As shown, RF system 500 includes RF integrated circuit 502 coupled to antenna 516 and oscillator 306. RF integrated circuit 502 may include one or more additional interface pins configured to be coupled to other portions of RF system 500 that are not illustrated in FIG. 7A. In various embodiments, RF integrated circuit 502 may be used in various RF applications including but not limited to cellular communication systems such as a cell phone radar systems such as automotive radar and other RF systems. RF integrated circuit 502 includes frequency doubler circuit 12, test multiplexer 304, duty cycle sensitive analog-to-digital converter 56, and control logic and interface circuitry 313. These blocks are configured to operate in accordance with the embodiment of FIGS. 5A-5E as described above, as well as the principle of operation of the embodiment of FIG. 1A. The output of test multiplexer 304 and digital bus DBUS may be coupled to an external test fixture as described above with respect to the embodiment of FIG. 5A. In some embodiments, the functionality of test fixture 308 may be incorporated within RF integrated circuit 502.

In addition to the above-mentioned blocks, RF integrated circuit 502 includes RF components such as RF front-end 508, downconverter 510, VCO 512, and phase locked loop circuitry 514. RF front-end 508 has an input port configured to be coupled to antenna 516 and RF front-end 508 includes RF circuitry configured to amplify RF signals received from antenna 516. Downconverter 510 is configured to downconvert the amplified RF signals to a lower frequency, such as an intermediate frequency (IF) or a baseband frequency. In some embodiments, downconverter 510 downconverts the amplified RF signals to a zero intermediate frequency (zero IF). The output of downconverter 510 is coupled to the input of optional anti-alias filter 506, which is configured to attenuate frequency components higher than one-half the sampling frequency of duty cycle sensitive analog-to-digital converter 56. In some embodiments, RF integrated circuit 502 also includes a transmit path (not shown) that is configured to provide a transmitted RF signal to antenna 516 and/or to another antenna (not shown). RF front-end 508 and downconverter 510 may be implemented using RF circuitry known in the art.

RF integrated circuit 502 also includes frequency generation blocks such as voltage-controlled oscillator (VCO) 512 and phase locked loop circuitry 514. In accordance with an embodiment of the invention, phase locked loop circuitry 514 receives second clock signal Clk2x and tunes VCO 512 to a frequency that is a multiple of the frequency of second clock signal Clk2x using phase locked loop circuits and systems known in the art. For example, phase locked loop circuitry 514 may include a phase detector, a charge pump, and one or more dividers and/or prescalers. VCO 512 may be implemented using VCO circuits known in the art. In one example, VCO 512 is implemented using a single ended or differential Colpitts or negative resistance oscillator, or other oscillator type. In some embodiments, all or portions of VCO 512 and phase locked loop circuitry 514 may be implemented external to RF integrated circuit 502.

RF integrated circuit 502 also includes optional processor 504 that is configured to perform baseband signal processing on the output ADCOUT of duty cycle sensitive analog-to-digital converter 56. In alternative embodiments, baseband signal processing may be performed by an external processor instead of or in addition to processor 504. In some embodiments, optional processor 504 may also perform baseband filtering instead of or in addition to baseband filter 506. Processor 504 may also provide data to an external data bus (not shown) and/or to control logic interface circuit 313.

Figure 7B:
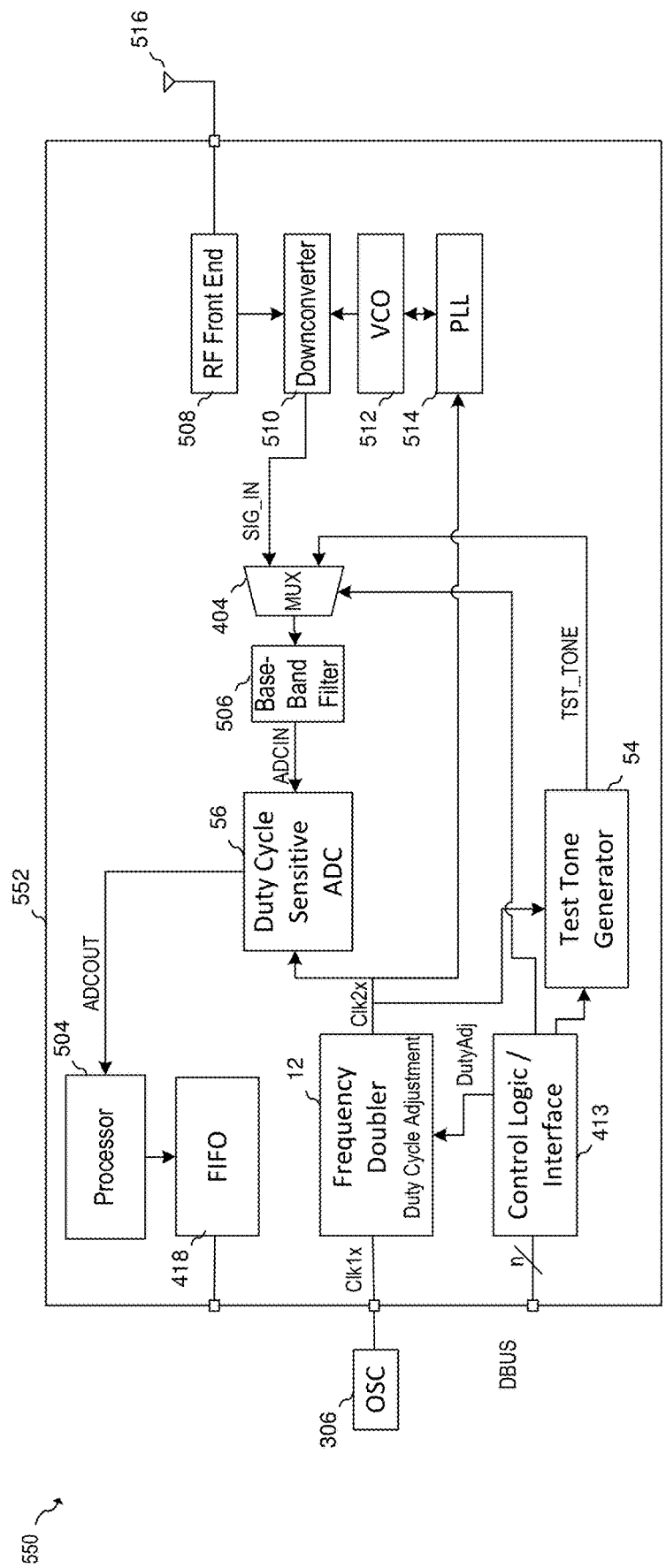

FIG. 7B illustrates an RF system 550 according to a further embodiment of the present invention. RF system 500 incorporates the frequency doubler duty cycle adjustment circuitry shown and described with respect to embodiments described above with the addition of additional RF circuitry described above with respect to FIG. 7A. During calibration, the output of test tone generator 54 is routed to the input of duty cycle sensitive analog-to-digital converter 56 via test multiplexer 404. In some embodiments, baseband filter 506 is coupled between test multiplexer 404 and the input of duty cycle sensitive analog-to-digital converter 56 to perform baseband filtering of the downconverter signal and/or anti-alias filtering of the baseband signal prior to its being converter by analog-to-digital converter 56.

As shown, RF integrated circuit 552 includes frequency doubler circuit 12, test multiplexer 404, duty cycle sensitive analog-to-digital converter 56, and control logic and interface circuitry 413, test tone generator 54, and FIFO 418. These blocks are configured to operate in accordance with the embodiment of FIGS. 6A-6D as described above, as well as the principle of operation of the embodiment of FIG. 1B. The output of FIFO 418 and digital bus DBUS may be coupled to an external test fixture 408 as described above with respect to the embodiment of FIG. 6A. In some embodiments, the functionality of test fixture 408 may be incorporated within RF integrated circuit 552. RF front-end 508, downconverter 510, VCO 512, phase locked loop circuitry 514, and anti-alias filter 506 operate as described above with respect to the embodiment of FIG. 7A.

It should be understood that the embodiments of FIGS. 7A and 7B are only two of many possible system implementations of embodiments of the present invention.

Figure 8:
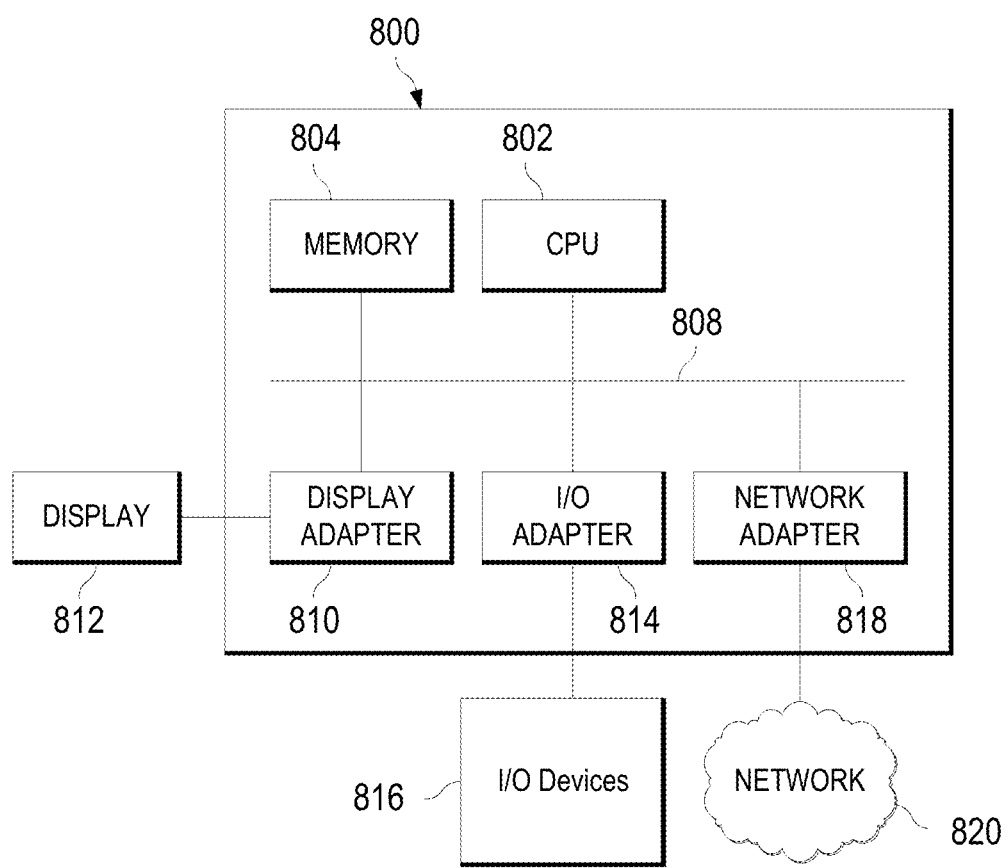
FIG. 8 illustrates a block diagram of a processing system that may be used to implement portions of embodiment systems.

Referring now to FIG. 8, a block diagram of a processing system 800 is provided in accordance with an embodiment of the present invention. The processing system 800 depicts a general-purpose platform and the general components and functionality that may be used to implement portions of the embodiment radar system and/or an external computer or processing device interfaced to the embodiment radar system. For example, processing system 800 may be used to implement processor 312 and/or control logic and interface circuitry 313 shown in FIG. 5A or control logic interface circuit 413 shown in FIG. 6A, and processor 504 shown in FIGS. 7A and 7B. In some embodiments, processing system 800 may be used to determine and evaluate embodiment duty cycle metrics, control operation of the embodiment RF systems, as well as control the calibration of frequency doubler 12.

Processing system 800 may include, for example, a central processing unit (CPU) 802, and memory 804 connected to a bus 808, and may be configured to perform the processes described above. In some embodiments, memory 804 may be used to implement memory 314 shown in FIGS. 5A and 6A. Alternatively, memory 314 may be separate from memory 804. The processing system 800 may further include, if desired or needed, a display adapter 810 to provide connectivity to a local display 812 and an input-output (I/O) Adapter 814 to provide an input/output interface for one or more input/output devices 816, such as a mouse, a keyboard, flash drive or the like.

The processing system 800 may also include a network interface 818, which may be implemented using a network adaptor configured to be coupled to a wired link, such as a network cable, USB interface, or the like, and/or a wireless/cellular link for communications with a network 820. The network interface 818 may also comprise a suitable receiver and transmitter for wireless communications. It should be noted that the processing system 800 may include other components. For example, the processing system 800 may include hardware components power supplies, cables, a motherboard, removable storage media, cases, and the like if implemented externally. These other components, although not shown, are considered part of the processing system 800. In some embodiments, processing system 800 may be implemented on a single monolithic semiconductor integrated circuit and/or on the same monolithic semiconductor integrated circuit as other disclosed system components.

Example embodiments of the present invention are summarized here. Other embodiments can also be understood from the entirety of the specification and the claims filed herein.

Embodiments of the present invention are summarized here. Other embodiments can also be understood from the entirety of the specification and the claims filed herein.

Example 1. A method including: receiving, by an adjustable frequency doubling circuit, a first clock signal having a first clock frequency; using the adjustable frequency doubling circuit, generating a second clock signal having a second clock frequency that is twice the first clock frequency; measuring a duty cycle parameter of the second clock signal, where the duty cycle parameter is dependent on a duty cycle of the first clock signal or a duty cycle of the second clock signal; and using the adjustable frequency doubling circuit, adjusting the duty cycle of the first clock signal or the second clock signal based on the measuring.

Example 2. The method of example 1, where: adjusting the duty cycle includes adjusting the duty cycle of the first clock signal; and the method further includes repeating the steps of measuring and adjusting until consecutive clock periods of the second clock signal have a substantially equal lengths.

Example 3. The method of one of examples 1 or 2, where: adjusting the duty cycle includes adjusting the duty cycle of the second clock signal; and the method further includes repeating the steps of measuring and adjusting until the duty cycle of the second clock signal is substantially 50%.

Example 4. The method of one of examples 1 to 3, where adjusting the duty cycle of the first clock signal or the second clock signal includes selecting one of a plurality of duty cycle settings of the adjustable frequency doubling circuit.

Example 5. The method of one of examples 1 to 4, where adjusting the duty cycle of the first clock signal includes selecting one of a plurality of duty cycle settings of a duty cycle correction circuit of the adjustable frequency doubling circuit coupled to an input of a frequency doubler of the adjustable frequency doubling circuit.

Example 6. The method of one of examples 1 to 5, where: the adjustable frequency doubling circuit includes an exclusive-OR gate and an adjustable delay circuit coupled to an input of the exclusive-OR gate; and adjusting the duty cycle of the second clock signal includes adjusting a delay of the adjustable delay circuit.

Example 7. The method of one of examples 1 to 6, further including correcting the duty cycle of the first clock signal before generating the second clock signal.

Example 8. The method of one of examples 1 to 7, where: measuring the duty cycle parameter of the second clock signal includes: clocking an analog-to-digital converter (ADC) with the second clock signal, receiving an analog test tone at a signal input of the ADC, digitizing the analog test tone by the ADC to form a first time domain digital signal, transforming the first time domain digital signal from a time domain to a frequency domain to form a first frequency domain signal, and measuring a difference a first frequency bin of the first frequency domain signal corresponding to a frequency of the analog test tone and at least one second frequency bin of the first frequency domain signal to form the measured duty cycle parameter; and adjusting the duty cycle of the second clock signal based on the measuring includes: generating a duty cycle adjustment signal based on the measured duty cycle parameter, and providing the duty cycle adjustment signal to the adjustable frequency doubling circuit.

Example 9. The method of example 8, where transforming the first time domain digital signal from the time domain to the frequency domain includes using an FFT.

Example 10. The method of example 8 or 9, where that at least one second frequency bin corresponds to fs/2−f1, where fs is a sampling rate of the ADC and f1 is the frequency of the analog test tone.

Example 11. The method of one of examples 1 to 10, further including: receiving an RF signal; downconverting the received RF signal to form a downconverted signal; and digitizing the downconverted signal.

Example 12. The method of one of examples 1 to 11, where measuring the duty cycle parameter of the second clock signal includes digitizing the second clock signal using an analog-to-digital converter to form a digitized second clock signal, and estimating the duty cycle parameter based on the digitized second clock signal.

Example 13. The method of claim 12, where estimating the duty cycle parameter based includes: transforming the digitized second clock signal from a time domain to a frequency domain to form a frequency domain second clock signal; and measuring a difference a first frequency bin of the frequency domain second clock signal corresponding to a frequency of the second clock signal and at least one second frequency bin of the frequency domain second clock signal to form the measured duty cycle parameter.

Example 14. A system including: an adjustable frequency doubling circuit including a clock input, a clock output and a duty cycle adjustment input, the adjustable frequency doubling circuit configured to receive a first clock signal having a first clock frequency at the clock input, generate a second clock signal having a second clock frequency that is twice the first clock frequency at the clock output, and adjust a duty cycle of the first clock signal or the second clock signal based on a duty cycle adjustment signal received at the duty cycle adjustment input; and a duty cycle measurement and adjustment circuit coupled to the clock output and to the duty cycle adjustment input of the adjustable frequency doubling circuit, the duty cycle measurement and adjustment circuit configured to measure a duty cycle parameter of the second clock signal and generate the duty cycle adjustment signal based on the measured duty cycle parameter.

Example 15. The system of example 14, where the duty cycle measurement and adjustment circuit is configured to iteratively measure the duty cycle parameter of the second clock signal and modify the duty cycle adjustment signal until the duty cycle of the second clock signal is substantially 50% or consecutive clock periods of the second clock signal have a substantially equal lengths.

Example 16. The system of one of examples 14 or 15, where the duty cycle adjustment signal is a digital signal.

Example 17. The system of one of examples 14 to 16, where the adjustable frequency doubling circuit includes: a delay circuit having a signal input coupled to the clock input; and an exclusive-OR gate having a first input coupled to the clock input, a second input coupled to an output of the delay circuit, and an output coupled to the clock output.

Example 18. The system of example 17, where the delay circuit is an adjustable delay circuit having a control input coupled to the duty cycle adjustment input.

Example 19. The system of example 18, where the adjustable delay circuit includes a plurality of selectable delay circuits.

Example 20. The system of one of examples 17 to 19, further including a duty cycle correction circuit having an input coupled to the clock input and an output coupled to the first input of the exclusive-OR gate and the signal input of the delay circuit.

Example 21. The system of one of examples 14 to 20, where the duty cycle measurement and adjustment circuit includes: an analog-to-digital converter (ADC) having a clock input coupled to the clock output of the adjustable frequency doubling circuit, an ADC signal input configured to receive an analog test tone, and an ADC signal output configured to provide a first time domain digital signal; and a duty cycle analysis and adjustment circuit coupled to the ADC signal output, the duty cycle analysis and adjustment circuit configured to: transform the first time domain digital signal from a time domain to a frequency domain to form a first frequency domain signal, measure a difference a first frequency bin of the first frequency domain signal corresponding to a frequency of the analog test tone and at least one second frequency bin of the first frequency domain signal to form the measured duty cycle parameter, and generate the duty cycle adjustment signal based on the measured duty cycle parameter.

Example 22. The system of example 21, where the adjustable frequency doubling circuit and the ADC are disposed on a first monolithic integrated circuit and the duty cycle analysis and adjustment circuit is disposed on a test fixture coupled to the first monolithic integrated circuit.

Example 23. The system of example 21 or 22, further including a radio frequency (RF) front-end having an output selectively coupled to the ADC signal input.

Example 24. The system of one of examples 14 to 23, where the duty cycle measurement and adjustment circuit includes: an analog-to-digital converter (ADC) having an ADC signal input coupled to the clock output of the adjustable frequency doubling circuit and an ADC signal output configured to provide a digitized second clock signal; and processor coupled to the ADC signal output of the ADC, the processor configured to: transform the digitized second clock signal from a time domain to a frequency domain to form a frequency domain second clock signal, measure a difference a first frequency bin of the frequency domain second clock signal corresponding to a frequency of the second clock signal and at least one second frequency bin of the frequency domain second clock signal to form the measured duty cycle parameter, and generate the duty cycle adjustment signal based on the measured duty cycle parameter.

Example 25. The system of example 24, where the adjustable frequency doubling circuit is disposed on a first monolithic integrated circuit and the duty cycle measurement and adjustment circuit is disposed on a test fixture coupled to the first monolithic integrated circuit.

Example 26. An RF system including: an RF front-end having an input port configured to be coupled to an antenna; a test tone generation circuit; a multiplexer having a first input coupled to an output of the RF front-end, and a second input coupled to an output of the test tone generation circuit; an adjustable frequency doubling circuit including a clock input, a clock output and a duty cycle adjustment input, the adjustable frequency doubling circuit configured to receive a first clock signal having a first clock frequency at the clock input, generate a second clock signal having a second clock frequency that is twice the first clock frequency at the clock output, and adjust a duty cycle of the first clock signal or the second clock signal based on a duty cycle adjustment signal received at the duty cycle adjustment input; and an analog-to-digital converter (ADC) having a clock input coupled to the clock output of the adjustable frequency doubling circuit, an ADC signal input coupled to an output of the multiplexer, and an ADC signal output configured to provide a first time domain digital signal.

Example 27. The RF system of example 26, further including: a test fixture coupled to the test tone generation circuit, the multiplexer, the adjustable frequency doubling circuit, and the ADC, the test fixture configured to, during a calibration mode: activate the test tone generation circuit, configure the multiplexer to select the output of the test tone generation circuit, determine a duty cycle parameter of the second clock signal based on digital data received from the ADC signal output, and generate the duty cycle adjustment signal based on the determined duty cycle.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method comprising:
receiving, by an adjustable frequency doubling circuit, a first clock signal having a first clock frequency;
using the adjustable frequency doubling circuit, generating a second clock signal having a second clock frequency that is twice the first clock frequency;
measuring a duty cycle parameter of the second clock signal, wherein the duty cycle parameter is dependent on a duty cycle of the first clock signal or a duty cycle of the second clock signal; and
using the adjustable frequency doubling circuit, adjusting the duty cycle of the first clock signal based on the measuring.

2. The method of claim 1, wherein:
the method further comprises repeating the steps of measuring and adjusting until consecutive clock periods of the second clock signal have a substantially equal lengths.

3. The method of claim 1, wherein:
adjusting the duty cycle further comprises adjusting the duty cycle of the second clock signal; and
the method further comprises repeating the steps of measuring and adjusting until the duty cycle of the second clock signal is substantially 50%.

4. A method comprising:
receiving, by an adjustable frequency doubling circuit, a first clock signal having a first clock frequency;
using the adjustable frequency doubling circuit, generating a second clock signal having a second clock frequency that is twice the first clock frequency;
measuring a duty cycle parameter of the second clock signal, wherein the duty cycle parameter is dependent on a duty cycle of the first clock signal or a duty cycle of the second clock signal; and using the adjustable frequency doubling circuit, adjusting the duty cycle of the first clock signal or the second clock signal based on the measuring, wherein adjusting the duty cycle of the first clock signal or the second clock signal comprises selecting one of a plurality of duty cycle settings of the adjustable frequency doubling circuit.

5. A method comprising:
receiving, by an adjustable frequency doubling circuit, a first clock signal having a first clock frequency;
using the adjustable frequency doubling circuit, generating a second clock signal having a second clock frequency that is twice the first clock frequency;
measuring a duty cycle parameter of the second clock signal, wherein the duty cycle parameter is dependent on a duty cycle of the first clock signal or a duty cycle of the second clock signal; and
using the adjustable frequency doubling circuit, adjusting the duty cycle of the first clock signal or the second clock signal based on the measuring, wherein adjusting the duty cycle of the first clock signal comprises selecting one of a plurality of duty cycle settings of a duty cycle correction circuit of the adjustable frequency doubling circuit coupled to an input of a frequency doubler of the adjustable frequency doubling circuit.

6. The method of claim 1, wherein:
the adjustable frequency doubling circuit comprises an exclusive-OR gate and an adjustable delay circuit coupled to an input of the exclusive-OR gate; and
adjusting the duty cycle of the second clock signal comprises adjusting a delay of the adjustable delay circuit.

7. The method of claim 1, further comprising correcting the duty cycle of the first clock signal before generating the second clock signal.

8. A method comprising:
receiving, by an adjustable frequency doubling circuit, a first clock signal having a first clock frequency;
using the adjustable frequency doubling circuit, generating a second clock signal having a second clock frequency that is twice the first clock frequency;
measuring a duty cycle parameter of the second clock signal, wherein the duty cycle parameter is dependent on a duty cycle of the first clock signal or a duty cycle of the second clock signal; and
using the adjustable frequency doubling circuit, adjusting the duty cycle of the first clock signal or the second clock signal based on the measuring, wherein:
measuring the duty cycle parameter of the second clock signal comprises:
clocking an analog-to-digital converter (ADC) with the second clock signal,
receiving an analog test tone at a signal input of the ADC,
digitizing the analog test tone by the ADC to form a first time domain digital signal,
transforming the first time domain digital signal from a time domain to a frequency domain to form a first frequency domain signal, and
measuring a difference a first frequency bin of the first frequency domain signal corresponding to a frequency of the analog test tone and at least one second frequency bin of the first frequency domain signal to form the measured duty cycle parameter; and
adjusting the duty cycle of the second clock signal based on the measuring comprises:
generating a duty cycle adjustment signal based on the measured duty cycle parameter, and
providing the duty cycle adjustment signal to the adjustable frequency doubling circuit.

9. The method of claim 8, wherein transforming the first time domain digital signal from the time domain to the frequency domain comprises using an FFT.

10. The method of claim 8, wherein the at least one second frequency bin corresponds to fs/2−f1, where fs is a sampling rate of the ADC and f1 is the frequency of the analog test tone.

11. The method of claim 8, further comprising:
receiving an RF signal;
downconverting the received RF signal to form a downconverted signal; and
digitizing the downconverted signal.

12. A method comprising:
receiving, by an adjustable frequency doubling circuit, a first clock signal having a first clock frequency;
using the adjustable frequency doubling circuit, generating a second clock signal having a second clock frequency that is twice the first clock frequency;
measuring a duty cycle parameter of the second clock signal, wherein the duty cycle parameter is dependent on a duty cycle of the first clock signal or a duty cycle of the second clock signal; and
using the adjustable frequency doubling circuit, adjusting the duty cycle of the first clock signal or the second clock signal based on the measuring, wherein measuring the duty cycle parameter of the second clock signal comprises digitizing the second clock signal using an analog-to-digital converter to form a digitized second clock signal, and estimating the duty cycle parameter based on the digitized second clock signal.

13. The method of claim 12, wherein estimating the duty cycle parameter based comprises:
transforming the digitized second clock signal from a time domain to a frequency domain to form a frequency domain second clock signal; and
measuring a difference a first frequency bin of the frequency domain second clock signal corresponding to a frequency of the second clock signal and at least one second frequency bin of the frequency domain second clock signal to form the measured duty cycle parameter.

14. A system comprising:
an adjustable frequency doubling circuit comprising a clock input, a clock output and a duty cycle adjustment input, the adjustable frequency doubling circuit configured to receive a first clock signal having a first clock frequency at the clock input, generate a second clock signal having a second clock frequency that is twice the first clock frequency at the clock output, and adjust a duty cycle of the first clock signal based on a duty cycle adjustment signal received at the duty cycle adjustment input; and
a duty cycle measurement and adjustment circuit coupled to the clock output and to the duty cycle adjustment input of the adjustable frequency doubling circuit, the duty cycle measurement and adjustment circuit configured to measure a duty cycle parameter of the second clock signal and generate the duty cycle adjustment signal based on the measured duty cycle parameter.

15. The system of claim 14, wherein the duty cycle measurement and adjustment circuit is configured to iteratively measure the duty cycle parameter of the second clock signal and modify the duty cycle adjustment signal until the duty cycle of the second clock signal is substantially 50% or consecutive clock periods of the second clock signal have substantially equal lengths.

16. A system comprising:
an adjustable frequency doubling circuit comprising a clock input, a clock output and a duty cycle adjustment input, the adjustable frequency doubling circuit configured to receive a first clock signal having a first clock frequency at the clock input, generate a second clock signal having a second clock frequency that is twice the first clock frequency at the clock output, and adjust a duty cycle of the first clock signal or the second clock signal based on a duty cycle adjustment signal received at the duty cycle adjustment input; and
a duty cycle measurement and adjustment circuit coupled to the clock output and to the duty cycle adjustment input of the adjustable frequency doubling circuit, the duty cycle measurement and adjustment circuit configured to measure a duty cycle parameter of the second clock signal and generate the duty cycle adjustment signal based on the measured duty cycle parameter, wherein the duty cycle adjustment signal is a digital signal.

17. The system of claim 14, wherein the adjustable frequency doubling circuit comprises:
a delay circuit having a signal input coupled to the clock input; and
an exclusive-OR gate having a first input coupled to the clock input, a second input coupled to an output of the delay circuit, and an output coupled to the clock output.

18. The system of claim 17, wherein the delay circuit is an adjustable delay circuit having a control input coupled to the duty cycle adjustment input.

19. The system of claim 18, wherein the adjustable delay circuit comprises a plurality of selectable delay circuits.

20. A system comprising:
an adjustable frequency doubling circuit comprising a clock input, a clock output and a duty cycle adjustment input, the adjustable frequency doubling circuit configured to receive a first clock signal having a first clock frequency at the clock input, generate a second clock signal having a second clock frequency that is twice the first clock frequency at the clock output, and adjust a duty cycle of the first clock signal or the second clock signal based on a duty cycle adjustment signal received at the duty cycle adjustment input, wherein the adjustable frequency doubling circuit comprises:
a delay circuit having a signal input coupled to the clock input, and
an exclusive-OR gate having a first input coupled to the clock input, a second input coupled to an output of the delay circuit, and an output coupled to the clock output;
a duty cycle measurement and adjustment circuit coupled to the clock output and to the duty cycle adjustment input of the adjustable frequency doubling circuit, the duty cycle measurement and adjustment circuit configured to measure a duty cycle parameter of the second clock signal and generate the duty cycle adjustment signal based on the measured duty cycle parameter; and
a duty cycle correction circuit having an input coupled to the clock input and an output coupled to the first input of the exclusive-OR gate and the signal input of the delay circuit.

21. A system comprising:
an adjustable frequency doubling circuit comprising a clock input, a clock output and a duty cycle adjustment input, the adjustable frequency doubling circuit configured to receive a first clock signal having a first clock frequency at the clock input, generate a second clock signal having a second clock frequency that is twice the first clock frequency at the clock output, and adjust a duty cycle of the first clock signal or the second clock signal based on a duty cycle adjustment signal received at the duty cycle adjustment input; and
a duty cycle measurement and adjustment circuit coupled to the clock output and to the duty cycle adjustment input of the adjustable frequency doubling circuit, the duty cycle measurement and adjustment circuit configured to measure a duty cycle parameter of the second clock signal and generate the duty cycle adjustment signal based on the measured duty cycle parameter, wherein the duty cycle measurement and adjustment circuit comprises:
an analog-to-digital converter (ADC) having a clock input coupled to the clock output of the adjustable frequency doubling circuit, an ADC signal input configured to receive an analog test tone, and an ADC signal output configured to provide a first time domain digital signal, and
a duty cycle analysis and adjustment circuit coupled to the ADC signal output, the duty cycle analysis and adjustment circuit configured to:
transform the first time domain digital signal from a time domain to a frequency domain to form a first frequency domain signal,
measure a difference a first frequency bin of the first frequency domain signal corresponding to a frequency of the analog test tone and at least one second frequency bin of the first frequency domain signal to form the measured duty cycle parameter, and
generate the duty cycle adjustment signal based on the measured duty cycle parameter.

22. The system of claim 21, wherein the adjustable frequency doubling circuit and the ADC are disposed on a first monolithic integrated circuit and the duty cycle analysis and adjustment circuit is disposed on a test fixture coupled to the first monolithic integrated circuit.

23. The system of claim 21, further comprising a radio frequency (RF) front-end having an output selectively coupled to the ADC signal input.

24. A system comprising:
an adjustable frequency doubling circuit comprising a clock input, a clock output and a duty cycle adjustment input, the adjustable frequency doubling circuit configured to receive a first clock signal having a first clock frequency at the clock input, generate a second clock signal having a second clock frequency that is twice the first clock frequency at the clock output, and adjust a duty cycle of the first clock signal or the second clock signal based on a duty cycle adjustment signal received at the duty cycle adjustment input; and
a duty cycle measurement and adjustment circuit coupled to the clock output and to the duty cycle adjustment input of the adjustable frequency doubling circuit, the duty cycle measurement and adjustment circuit configured to measure a duty cycle parameter of the second clock signal and generate the duty cycle adjustment signal based on the measured duty cycle parameter, wherein the duty cycle measurement and adjustment circuit comprises:
an analog-to-digital converter (ADC) having an ADC signal input coupled to the clock output of the adjustable frequency doubling circuit and an ADC signal output configured to provide a digitized second clock signal, and processor coupled to the ADC signal output of the ADC, the processor configured to:
transform the digitized second clock signal from a time domain to a frequency domain to form a frequency domain second clock signal,
measure a difference a first frequency bin of the frequency domain second clock signal corresponding to a frequency of the second clock signal and at least one second frequency bin of the frequency domain second clock signal to form the measured duty cycle parameter, and
generate the duty cycle adjustment signal based on the measured duty cycle parameter.

25. The system of claim 24, wherein the adjustable frequency doubling circuit is disposed on a first monolithic integrated circuit and the duty cycle measurement and adjustment circuit is disposed on a test fixture coupled to the first monolithic integrated circuit.

26. An RF system comprising:
an RF front-end having an input port configured to be coupled to an antenna;
a test tone generation circuit;
a multiplexer having a first input coupled to an output of the RF front-end, and a second input coupled to an output of the test tone generation circuit;
an adjustable frequency doubling circuit comprising a clock input, a clock output and a duty cycle adjustment input, the adjustable frequency doubling circuit configured to receive a first clock signal having a first clock frequency at the clock input, generate a second clock signal having a second clock frequency that is twice the first clock frequency at the clock output, and adjust a duty cycle of the first clock signal or the second clock signal based on a duty cycle adjustment signal received at the duty cycle adjustment input; and
an analog-to-digital converter (ADC) having a clock input coupled to the clock output of the adjustable frequency doubling circuit, an ADC signal input coupled to an output of the multiplexer, and an ADC signal output configured to provide a first time domain digital signal.

27. The RF system of claim 26, further comprising:
a test fixture coupled to the test tone generation circuit, the multiplexer, the adjustable frequency doubling circuit, and the ADC, the test fixture configured to, during a calibration mode:
activate the test tone generation circuit,
configure the multiplexer to select the output of the test tone generation circuit,
determine a duty cycle parameter of the second clock signal based on digital data received from the ADC signal output, and
generate the duty cycle adjustment signal based on the determined duty cycle parameter.

* * * * *

UNITED STATES PATENT AND TRADEMARK OFFICE
CERTIFICATE OF CORRECTION

PATENT NO. : 10,911,165 B1
APPLICATION NO. : 16/724888
DATED : February 2, 2021
INVENTOR(S) : Siegfried Albel et al.

Page 1 of 1

It is certified that error appears in the above-identified patent and that said Letters Patent is hereby corrected as shown below:

In the Claims

In Column 26, Line 50, Claim 2, delete "have a substantially equal" and insert --have substantially equal--.

Signed and Sealed this
Third Day of August, 2021

Drew Hirshfeld
*Performing the Functions and Duties of the
Under Secretary of Commerce for Intellectual Property and
Director of the United States Patent and Trademark Office*